(12) United States Patent
Zhang et al.

(10) Patent No.: US 11,715,408 B1
(45) Date of Patent: Aug. 1, 2023

(54) DRIVING CIRCUIT, DRIVING METHOD, AND DISPLAY PANEL WITH IMPROVED CONTROL OF VOLTAGE OUTPUT BY SHIFT REGISTER

(71) Applicants: Wuhan Tianma Micro-Electronics Co., Ltd., Wuhan (CN); Wuhan Tianma MicroElectronics Co., Ltd. Shanghai Branch, Shanghai (CN)

(72) Inventors: Mengmeng Zhang, Shanghai (CN); Jing Huang, Shanghai (CN)

(73) Assignees: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 0 days.

(21) Appl. No.: 17/879,604

(22) Filed: Aug. 2, 2022

(30) Foreign Application Priority Data

May 30, 2022 (CN) .......................... 202210597694.6

(51) Int. Cl.
*G09G 3/3266* (2016.01)
*G09G 3/20* (2006.01)
*G11C 19/28* (2006.01)

(52) U.S. Cl.
CPC .......... *G09G 3/2092* (2013.01); *G11C 19/28* (2013.01); *G09G 2300/0852* (2013.01); *G09G 2310/0286* (2013.01)

(58) Field of Classification Search
CPC ......... G09G 3/2092; G09G 2300/0852; G09G 2310/0286; G11C 19/28
See application file for complete search history.

(56) References Cited

U.S. PATENT DOCUMENTS

| | | | |
|---|---|---|---|
| 2017/0345366 A1* | 11/2017 | Jang ..................... | G09G 3/3266 |
| 2019/0073949 A1* | 3/2019 | Zhang ................. | G09G 3/3677 |
| 2020/0152127 A1* | 5/2020 | Kang ................... | G09G 3/3266 |

FOREIGN PATENT DOCUMENTS

| | | |
|---|---|---|
| CN | 112150961 A | 12/2020 |
| CN | 112687229 A | 4/2021 |

* cited by examiner

*Primary Examiner* — Adam J Snyder
(74) *Attorney, Agent, or Firm* — Anova Law Group, PLLC

(57) ABSTRACT

A driving circuit includes at least two shift registers in cascade. In each shift register, a first output control module is configured to transmit a voltage of a first voltage terminal to an output terminal in response to a turn-on level of a first node. A second output control module is configured to transmit a voltage of a second voltage terminal to an output terminal in response to a turn-on level of a second node. A first node control module is configured to transmit a voltage of the input terminal to the first node in response to a turn-on level of a first clock signal terminal and transmit a voltage of the second voltage terminal to the first node in response to turn-on levels of the second clock signal terminal and the third node or in response to the turn-on level of the second node.

18 Claims, 15 Drawing Sheets

In the first output stage, the first node control module transmits the voltage of the input terminal to the first node in response to the turn-on level of the first clock signal terminal, such that the first output control module is turned on and the signal of the first voltage terminal is output through the output terminal

In the first node voltage maintaining stage, the first node potential maintaining module transmits the signal of the input terminal to the fourth node in respond to the turn-on level of the first clock signal terminal, and transmits the first level signal to the first node in respond to the signal of the fourth node and the signal of the second clock signal terminal or in response to the signals of the input terminal, the fourth node and the second clock signal terminal. The voltage of the first level signal is lower than the voltage of the first voltage terminal.

FIG. 14

DRIVING CIRCUIT, DRIVING METHOD, AND DISPLAY PANEL WITH IMPROVED CONTROL OF VOLTAGE OUTPUT BY SHIFT REGISTER

CROSS-REFERENCE TO RELATED APPLICATION

This application claims the priority of Chinese Patent Application No. 202210597694.6, filed on May 30, 2022, the content of which is incorporated herein by reference in its entirety.

TECHNICAL FIELD

The present disclosure generally relates to the field of display technologies and, more particularly, relates to a driving circuit, a driving method, and a display panel.

BACKGROUND

A display panel usually includes a display region and a non-display region. Sub-pixel units are arranged in an array in the display region. A driving circuit, such as a gate driving circuit, is arranged in the non-display region. The gate driving circuit is used to output a gate drive signal to control the sub-pixel units in the display area to emit light in an orderly manner. The output of the gate driving circuit directly affects the display effect of the sub-pixel units. Therefore, the gate driving circuit has always been a major research focus in the display field, and it has become an inevitable trend to provide a driving circuit with stable output.

SUMMARY

One aspect of the present disclosure provides a driving circuit. The driving circuit includes at least two shift registers in cascade. Each shift register includes: an input terminal, an output terminal, a first voltage terminal, a second voltage terminal, a first clock signal terminal, a second clock signal terminal, a first output module, a second output module, a first node control module, a second node control module, a third node control module, and a first node potential maintaining module. The first output control module is configured to transmit a voltage of the first voltage terminal to the output terminal in response to a turn-on level of a first node. The second output control module is configured to transmit a voltage of the second voltage terminal to the output terminal in response to a turn-on level of a second node. The first node control module is configured to transmit a voltage of the input terminal to the first node in response to a turn-on level of the first clock signal terminal, and transmit a voltage of the second voltage terminal to the first node in response to turn-on levels of the second clock signal terminal and the third node or in response to the turn-on level of the second node. The second node control module is configured to transmit the voltage of the second voltage terminal to the second node in response to the turn-on level of the first node, and transmit the voltage of the second voltage terminal to the second node in response to turn-on levels of a third node and the second clock signal terminal. The third node control module is configured to transmit the voltage of the first voltage terminal to the third node in response to the turn-on level of the first clock signal terminal, and transmit the voltage of the first clock signal terminal to the third node in response to a turn-on level of a fourth node. The first node potential maintaining module electrically connected to the fourth node with the first node control module is configured to transmit a first level signal to the first node in response to the turn-on level of the fourth node and a signal at the second clock signal terminal, or in response to signals at the input terminal, the fourth node and the second clock signal terminal, wherein a voltage of the first level signal is lower than the voltage of the first voltage terminal.

Another aspect of the present disclosure provides a driving method for a driving circuit. The driving circuit includes at least two shift registers in cascade. Each shift register includes: an input terminal, an output terminal, a first voltage terminal, a second voltage terminal, a first clock signal terminal, a second clock signal terminal, a first output module, a second output module, a first node control module, a second node control module, a third node control module, and a first node potential maintaining module. The first output control module is configured to transmit a voltage of the first voltage terminal to the output terminal in response to a turn-on level of a first node. The second output control module is configured to transmit a voltage of the second voltage terminal to the output terminal in response to a turn-on level of a second node. The first node control module is configured to transmit a voltage of the input terminal to the first node in response to a turn-on level of the first clock signal terminal, and transmit a voltage of the second voltage terminal to the first node in response to turn-on levels of the second clock signal terminal and the third node or in response to the turn-on level of the second node. The second node control module is configured to transmit the voltage of the second voltage terminal to the second node in response to the turn-on level of the first node, and transmit the voltage of the second voltage terminal to the second node in response to turn-on levels of a third node and the second clock signal terminal. The third node control module is configured to transmit the voltage of the first voltage terminal to the third node in response to the turn-on level of the first clock signal terminal, and transmit the voltage of the first clock signal terminal to the third node in response to a turn-on level of a fourth node. The first node potential maintaining module electrically connected to the fourth node with the first node control module is configured to transmit a first level signal to the first node in response to the turn-on level of the fourth node and a signal at the second clock signal terminal, or in response to signals at the input terminal, the fourth node and the second clock signal terminal, wherein a voltage of the first level signal is lower than the voltage of the first voltage terminal. The driving method includes: in a first output stage, the first node control module transmits the voltage of the input terminal to the first node in response to the turn-on level of the first clock signal terminal, such that the first output control module is turned on and the signal of the first voltage terminal is output through the output terminal; and in a first node voltage maintaining stage, the first node potential maintaining module transmits the signal of the input terminal to the fourth node in response to the turn-on level of the first clock signal terminal, and transmits the first level signal to the first node in response to the signal of the fourth node and the signal of the second clock signal terminal or in response to the signals of the input terminal, the fourth node and the second clock signal terminal, wherein the voltage of the first level signal is lower than the voltage of the first voltage terminal.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 14 illustrates a flow chart of a driving method consistent with various disclosed embodiments in the present disclosure.

DETAILED DESCRIPTION

Figure 1:
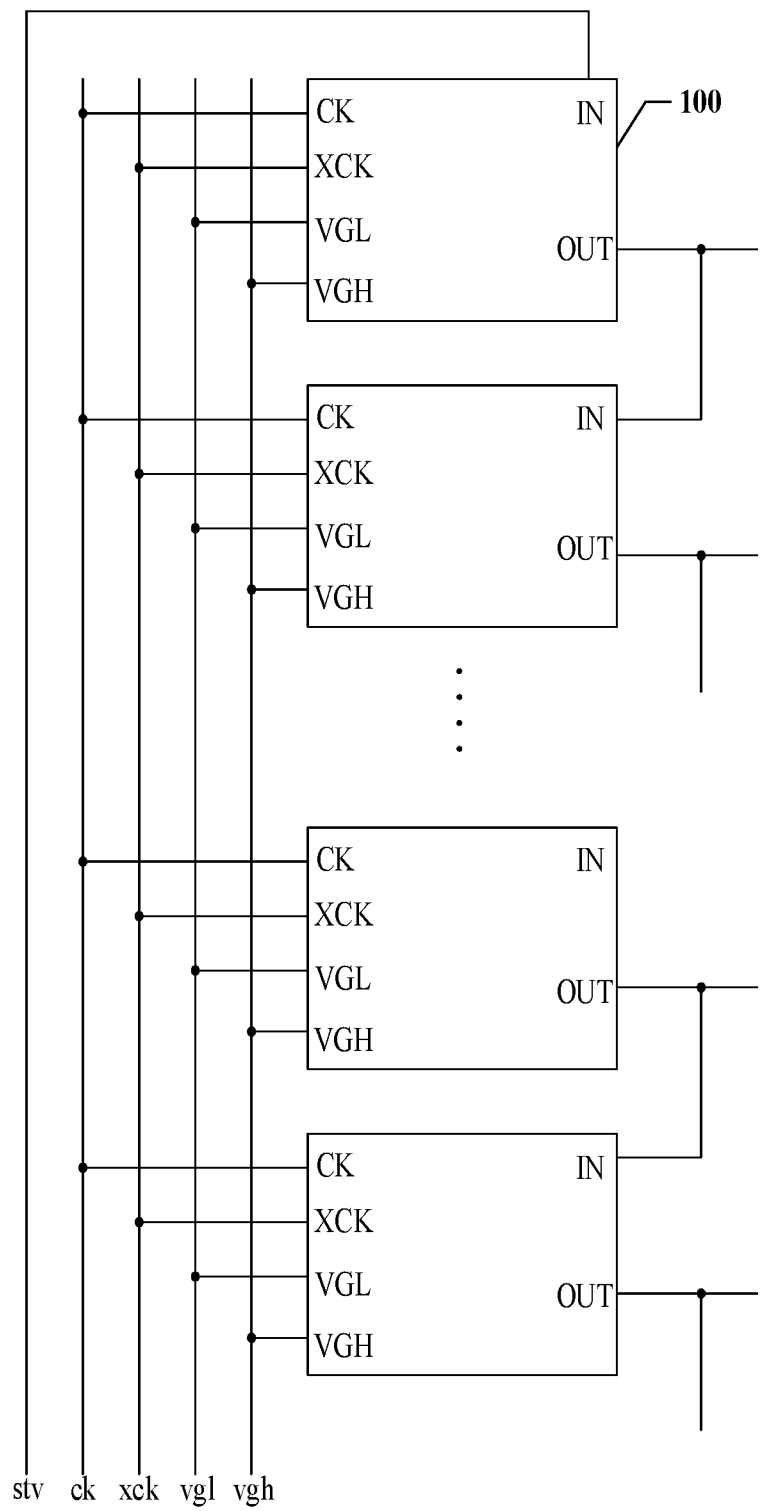
FIG. 1 illustrates a structure of a driving circuit consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

Figure 2:
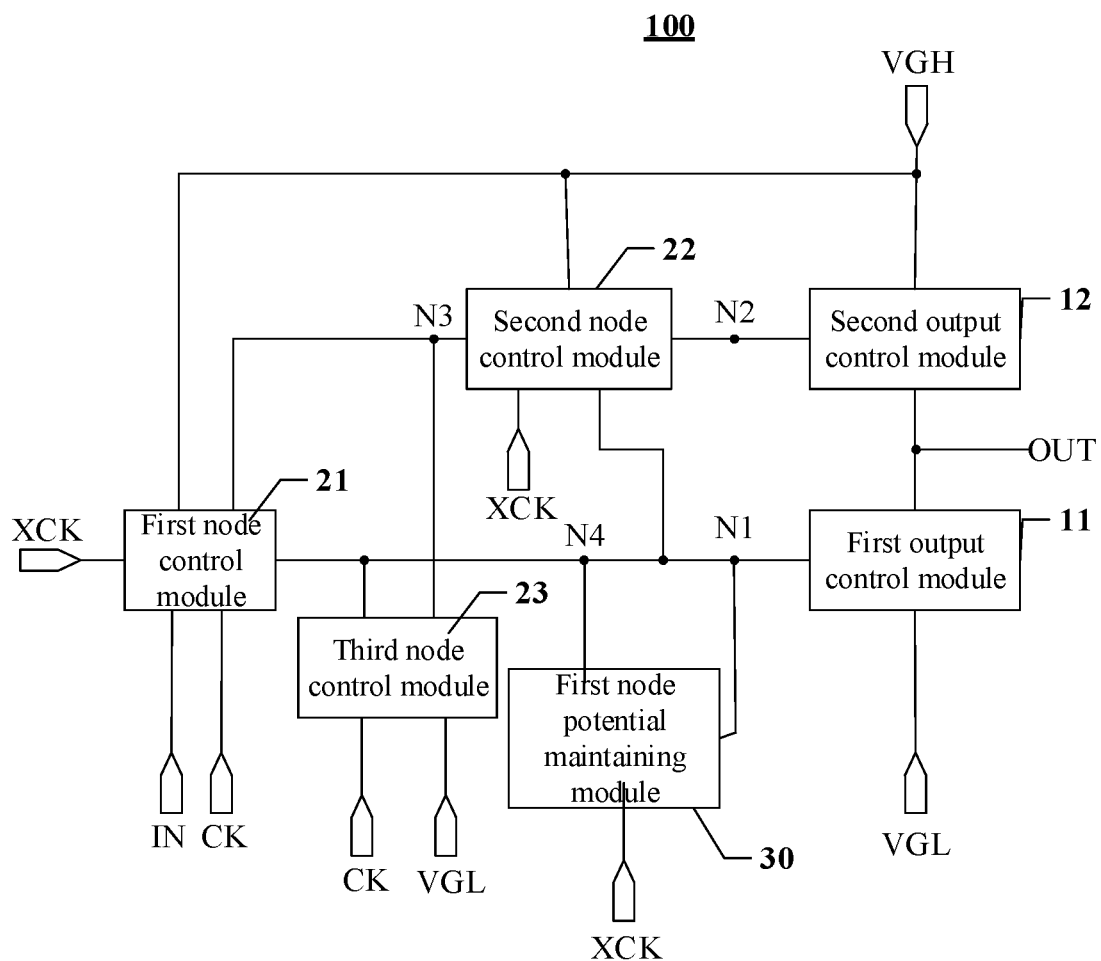
FIG. 2 illustrates a structure of a shift register in a driving circuit consistent with various disclosed embodiments in the present disclosure.
Figure 3:
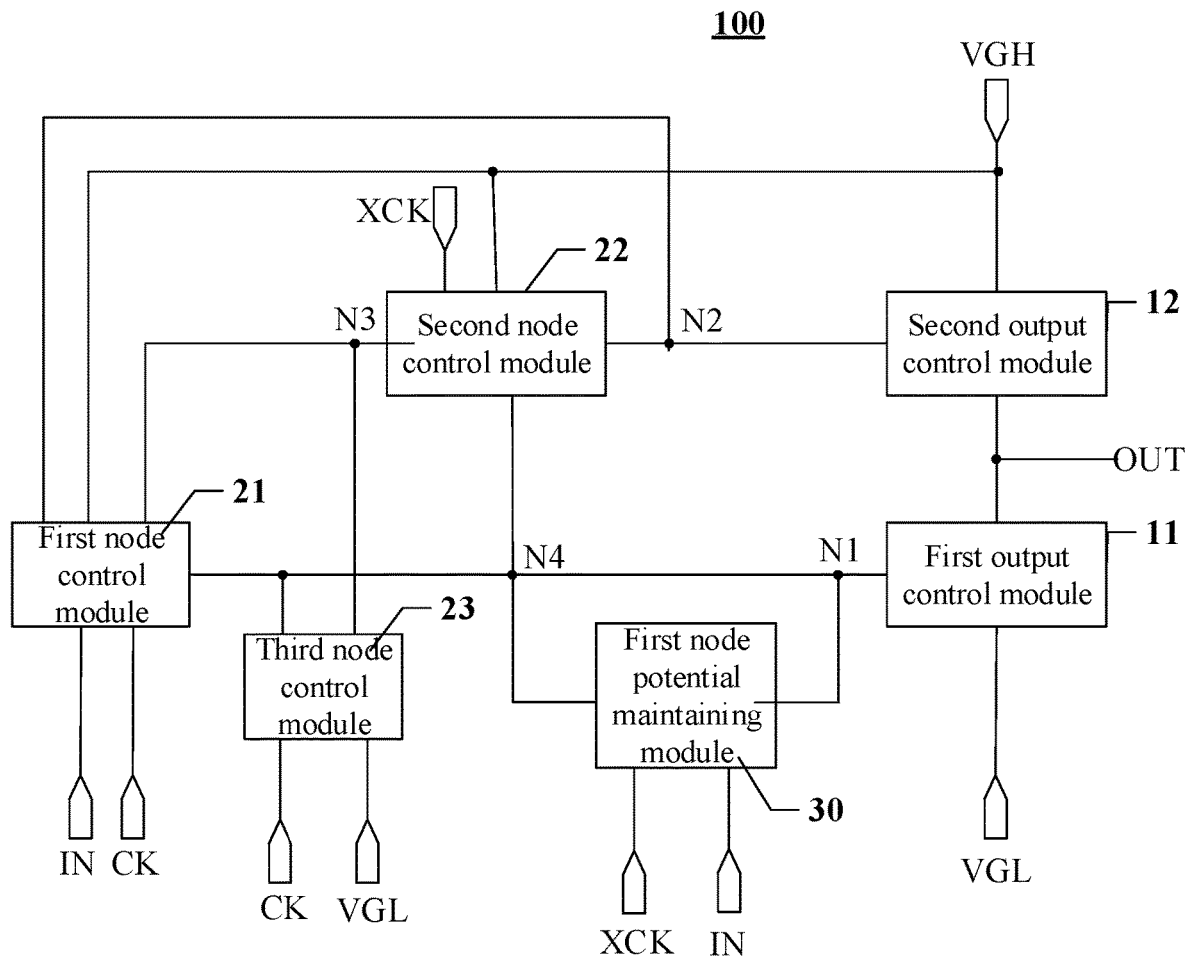
FIG. 3 illustrates another structure of a shift register in a driving circuit consistent with various disclosed embodiments in the present disclosure.

The present disclosure provides a driving circuit. FIG. 1 illustrates a structural diagram of a driving circuit according to one embodiment of the present disclosure, FIG. 2 illustrates a structural diagram of a shift register in a driving circuit according to one embodiment of the present disclosure, and FIG. 3 illustrates another structural diagram of a shift register in a driving circuit according to one embodiment of the present disclosure. As shown in FIGS. 1-3, one embodiment of the present disclosure provides a driving circuit 200. The driving circuit 200 may include at least two shift registers 100 in cascade. One shift register 100 of the at least two shift registers 100 may include an input terminal IN, an output terminal OUT, a first voltage terminal VGL, a second voltage terminal VGH, a first clock signal terminal CK, a second clock signal terminal XCK, a first output control module 11, a second output control module 12, a first node control module 21, a second node control module 22, a third node control module 23, and a first node potential maintaining module 30.

The first output control module 11 may be configured to transmit a voltage of the first voltage terminal VGL to the output terminal OUT in response to a turn-on electrical level of the first node N1.

The second output control module 12 may be configured to transmit a voltage of the second voltage terminal VGH to the output terminal OUT in response to a turn-on electrical level of the second node N2.

The first node control module 21 may be configured to transmit a voltage of the input terminal IN to the first node N1 in response to a turn-on electrical level of the first clock signal terminal CK, and transmit a voltage of the second voltage terminal VGH to the first node N1 in response to turn-on electrical levels of the second clock signal terminal XCK and the third node N3 or in response to a turn-on electrical level of the second node N2.

The second node control module 22 may be configured to transmit a voltage of the second voltage terminal VGH to the second node N2 in response to a turn-on electrical level of the first node N1, and transmit a voltage of the second clock signal terminal XCK to the second node N2 in response to turn-on electrical levels of third node N3 and the second clock signal terminal XCK.

The third node control module 23 is configured to transmit the voltage of the first voltage terminal VGL to the third node N3 in response to the turn-on electrical level of the first clock signal terminal CK, and transmit the voltage of the first clock signal terminal CK to the third node N3 in response to the turn-on electrical level of the fourth node N4.

The first node potential maintaining module 30 may be electrically connected to the fourth node N4 with the first node control module 21, and may be configured to transmit a first electrical level signal to the first node N1 in response to the turn-on electrical level of the fourth node N4 and the signal of the second clock signal terminal XCK or in response to signals of the input terminals IN, the fourth node N4, and the second clock signal terminal XCK. The voltage of the first electrical level signal may be lower than the voltage of the first voltage terminal VGL.

Optionally, the shift register 100 may include transistors. In one embodiment, the turn-on level and the turn-off level may be distinguished according to a type of a transistor. The turn-on level may be a level capable of turning on a corresponding transistor. The turn-off level may be a level capable of turning off a corresponding transistor. For example, when the transistor is a P-type transistor, the turn-on level may be low and the turn-off level may be high. When the transistor is an N-type transistor, the turn-on level may be high, and the turn-off level may be low. It should also be noted that, one of the first voltage terminal VGL and the second voltage terminal VGH may output a high level and another may output a low level. For the convenience of description, one embodiment where the transistor is a P-type transistor, the first voltage terminal VGL outputs a low level, and the second voltage terminal VGH outputs a high level, will be used as an example to illustrate the present disclosure. In this case, the turn-on level may be low and the turn-off level may be high.

FIG. 1 only illustrates the connection relationship of some of the shift registers 100 in the driving circuit, and does not represent the number and size of the shift register 100 which are actually included in the driving circuit. When the driving circuit is applied to the display panel, the driving circuit shown in FIG. 1 may be arranged in the non-display region at one side of the display area. In another embodiment, the driving circuit shown in FIG. 1 may be arranged in the non-display region at both sides of the display area. The present disclosure has no specific limits on this.

In one embodiment, as shown in FIG. 1, when the driving circuit provided by the present disclosure is applied to a display panel, the first voltage terminal VGL of the shift register 100 of each stage may be electrically connected to a first voltage signal line vgl of the display panel, the second voltage terminal VGH may be electrically connected to a second voltage signal line vgl of the display panel, the first clock signal terminal CK may be electrically connected to a first clock signal line ck of the display panel, and the second clock signal terminal XCK may be electrically connected to a second clock signal line xck of the display panel. The input terminal IN of the shift register 100 of the first stage may be electrically connected to a start trigger signal line sty of the display panel. Except for the shift register 100 of the first stage, the input terminal IN of each of other shift registers 100 may be electrically connected to the output terminal OUT of the shift register 100 of the previous stage.

As shown in FIG. 2 and FIG. 3, to clearly illustrate the electrical connection relationship of each module in the shift register 100, the first node N1, the second node N2, the third node N3 are labeled in the circuit schematic diagram of the shift register 100. The electrical potential of the first node N1 may be controlled by the first node control module 21, the electrical potential of the second node N2 may be controlled by the second node control module 22, and the electrical potential of the third node N3 may be controlled by the third node control module 23. When the electrical potential of the first node N1 is controlled by the first node control module 21, the first node control module 21 may be able to choose to transmit the voltage of the input terminal IN or the voltage of the second voltage terminal VGH to the first node N1, such that the electrical potential first of the node N1 is a low potential or a high potential to control turning on or turning off the first output control module 11. When the electrical potential of the second node N2 is controlled by the second node control module 22, the second node control module 22 may be able to choose to transmit the voltage of the second voltage terminal VGH or the voltage of the second clock signal terminal XCK to the second node N2, such that the potential of the second node N2 is a high potential or a low potential to control turning on or turning off the second output control module 12. When the electrical potential of the third node N3 is controlled by the third node control module 23, the voltage of the first voltage terminal VGL or the voltage of the first clock signal terminal CK may be selectively transmitted to the third node N3, such that the electrical potential of the third node N3 is a low potential or a high potential, realizing the control of the second node control module 22.

In practical application, the first output control module 11 may respond to the turn-on level of the first node N1, and output the voltage of the first voltage terminal VGL through the output terminal OUT. The second output control module 12 may respond to the turn-on level of the second node N2 and output the voltage of the second voltage terminal VGH through the output terminal OUT. Optionally, in one embodiment, the first output control module 11 and the second output control module 12 may be alternately turned on, such that the signal of the first voltage terminal VGL and the signal of the second voltage terminal VGH may be alternately output from the output terminal OUT.

In existing technologies, when the shift register is working, the voltage of the internal control node inevitably has a threshold loss, such that the corresponding switch module cannot be fully turned on (fully conductive state). Therefore, the level transmitted to the output terminal of the shift register cannot reach a target voltage, resulting in a tailing phenomenon and affecting the display effect.

In the gate driving circuit provided by the embodiments of the present disclosure, the first node potential maintaining module 30 may be introduced into the shift register 100. In one embodiment shown in FIG. 2, the first node potential maintaining module 30 may be configured to respond to the signal of the fourth node N4 and the signal of the second clock signal terminal XCK to transmit a first electrical level signal to the first node N1. The voltage of the first electrical level signal may be lower than the voltage of the first voltage terminal VGL. In another embodiment shown in FIG. 3, the first node potential maintaining module 30 may be configured to transmit the first electrical level signal to the first node N1 in response to the signals of the input terminal IN, the fourth node N4 and the second clock signal terminal XCK. The voltage of the first electrical level signal may be lower than the voltage of the first voltage terminal VGL. When the first output control module 11 is turned on and outputs the signal of the first voltage terminal VGL through the output control module, the first node potential maintaining module 30 may be controlled to transmit the first electrical level signal with a lower voltage value to the first node N1, to pull down the potential of the first node N1. When the potential of the first node N1 is pulled down, the threshold loss of the first node N1 may be compensated. After the threshold value of the first node N1 is compensated, it may be beneficial to maintain the turn-on state of the first output control module 11 in a constant state such that the first output control module 11 is fully turned on. Therefore, the first output control module 11 may constantly output the signal of the first voltage terminal VGL from the first output control module 11, to avoid the tailing phenomenon and improve the display effect of the display panel when the driving circuit is applied to display panel.

As shown in FIGS. 2 and 3, in one embodiment, the first node potential maintaining module 30 may be connected in series between the fourth node N4 and the first node N1. The first node control module 21 may be connected to the first node N1 through the fourth node N4. The second node control module 22 may be electrically connected to the second node N2 and the third node N3 respectively. The third node control module 23 may be connected to the third node N3. The first output control module 11 and the second output control module 12 may be connected in series between the first voltage terminal VGL and the second voltage terminal VGH. The control terminal of the first output control module 11 may be connected to the first node N1, and the control terminal of the second output control module 12 may be connected to the second node N2.

In the shift register 100 of the gate driving circuit provided by the embodiment in FIG. 2, the first node control module 21 may be respectively connected to the input terminal IN, the first clock signal terminal CK, the second clock signal terminal XCK, the second voltage terminals VGH, the first node N1 and the third node N3 electrically. When the turn-on-level of the first clock signal is transmitted to the first node control module 21, the first node control module 21 may transmit the voltage of the input terminal IN to the first node N1. When the turn-on level of the second clock signal terminal XCK and the third node N3 is transmitted to the first node control module 21, the first node control module 21 may transmit the voltage of the second voltage terminal VGH to the first node N1.

In another embodiment shown in FIG. 3, the first node control module 21 may be respectively and electrically connected to the input terminal IN, the first clock signal terminal CK, the second voltage terminal VGH, the first node N1, the second node N2 and the third node N3. When the turn-on level of the first clock signal is transmitted to the first node control module 21, the first node control module 21 may transmit the voltage of the input terminal IN to the first node N1. When the turn-on level of the second node N2 is transmitted to the first node control module 21, the first node control module may transmit the voltage of the second voltage terminal VGH to the first node N1.

As shown in FIG. 2 and FIG. 3, the second node control module 22 may be electrically and respectively connected to the first node N1, the second node N2, the third node N3, the second voltage terminal VGH and the second clock signal terminal XCK. When the turn-on level of the first node N1 is received, the second node control module 22 may be configured to transmit the voltage of the second voltage terminal VGH to the second node N2. When receiving the turn-on level of the third node N3 and the second clock signal terminal XCK, the second node control module 22 may be configured to transmit the voltage of the second clock signal terminal to the second node N2. The third node control module 23 may be electrically and respectively connected to the third node N3, the fourth node N4, the first clock signal terminal CK and the first voltage terminal VGL. When receiving the turn-on level of the first clock signal terminal CK, the third node control module 23 may be configured to transmit the voltage of the first voltage terminal VGL to the third node N3. When receiving the turn-on level of the fourth node N4, the third node control module 23 may be configured to transmit the voltage of the first clock signal terminal CK to the third node N3. In the embodiment shown in FIG. 2, the first node potential maintaining module 30 may be respectively connected to the first node N1, the fourth node N4 and the second clock signal terminal XCK, according to the turn-on level of the fourth node N4 and the signal of the second clock signal terminal XCK. In the embodiment shown in FIG. 3, the first node potential position module 30 may be electrically connected to the input terminal IN in addition to the first node N1, the fourth node N4 and the second clock signal terminal XCK. The first node potential maintaining module 30 in the embodiments of FIG. 2 and FIG. 3 may both be able to transmit the first level signal to the first node N1, and the voltage of the first level signal may be lower than the voltage value of the first voltage terminal VGL, such that the potential of the first node N1 may be pulled down to compensate the threshold loss of the first node N1. Therefore, the first output control module 11 may be fully turned on, and the occurrence of the tailing phenomenon may be suppressed.

Figure 4:
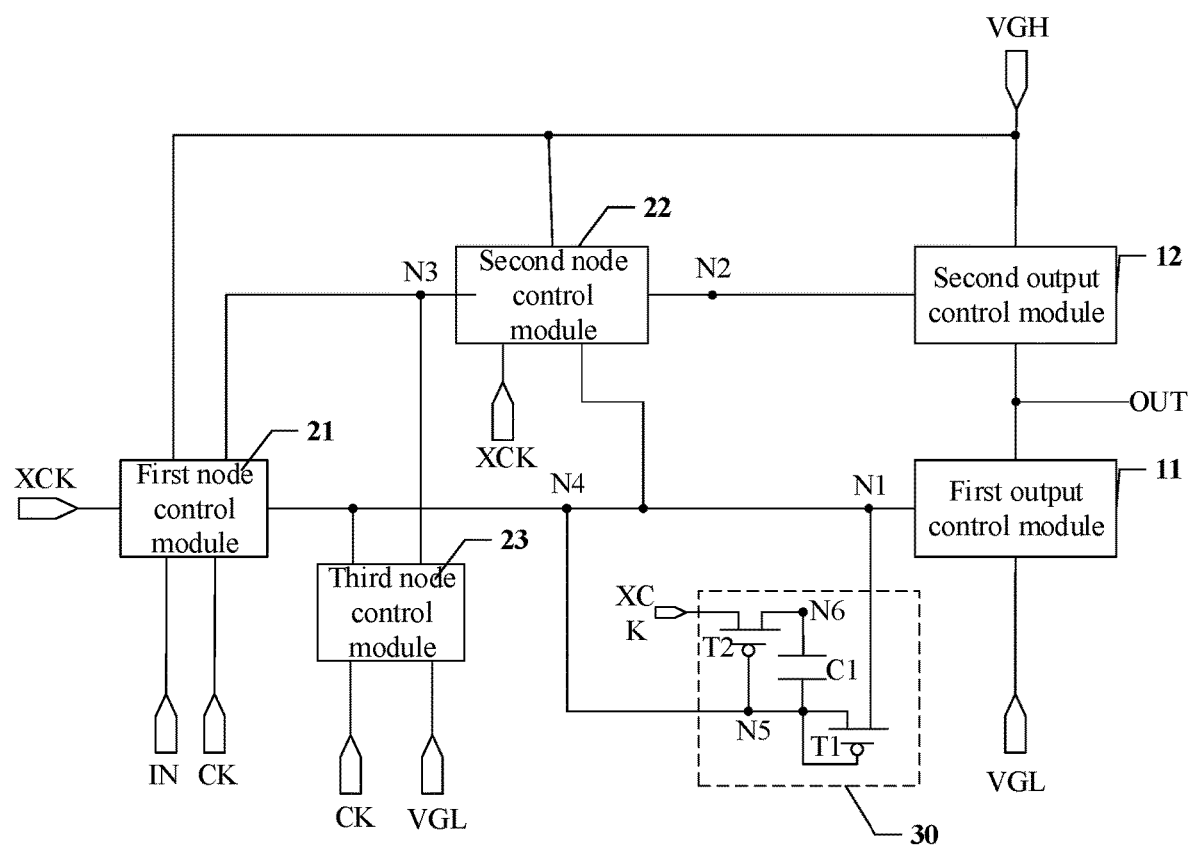
FIG. 4 illustrates another structure of a shift register in a driving circuit consistent with various disclosed embodiments in the present disclosure.

FIG. 4 illustrates another structure of a shift register 100 in a driving circuit consistent with various disclosed embodiments in the present disclosure. An exemplary structure of the first node potential maintaining module 30 in the shift register 100 is shown in the present embodiment.

As shown in FIG. 4, in one embodiment of the present disclosure, the first node potential maintaining module 30 may include a first transistor T1, a second transistor T2 and a first capacitor C1. A gate of the first transistor T1 may be connected to a first terminal of the first transistor T1 and may be further coupled and connected to the fifth node N5. A second terminal of the first transistor T1 may be connected to the first node N1. The fifth node N5 may be electrically connected to the fourth node N4.

A gate of the second transistor T2 may be connected to the fifth node N5. A first terminal of the second transistor T2 may be connected to the second clock signal terminal XCK, and a second terminal of the second transistor T2 may be connected to the sixth node N6. Two terminals of the first capacitor C1 may be respectively connected to the sixth node N6 and the first terminal of the transistor T1.

FIG. 4 shows an exemplary structure of the first node potential maintaining module 30 in the shift register 100. In one embodiment, the first node potential maintaining module 30 may include the first transistor T1, the second transistor T2 and the first capacitor C1. For description purposes only, the embodiment where the first transistor T1 and the second transistor T2 are both P-type transistors is used as an example to illustrate the present disclosure, and does not limit the scope of the present disclosure. In some other embodiments, the first transistor T1 or the second transistor T2 may be N-type transistors. The present disclosure has no limit on this.

The gate and first terminal of the first transistor T1 may be connected together and connected to the fifth node N5, and the second electrode of the first transistor T1 may be connected to the first node N1. The gate of the second transistor T2 may be connected to the fifth node N5, the first terminal of the second transistor T2 may be connected to the second clock signal terminal XCK, and the second terminal of the second transistor T2 may be connected to the sixth node N6. One terminal of the first capacitor C1 may be connected to the sixth node N6 and another terminal of the first capacitor C1 may be connected to the gate and the first terminal of the first transistor T1. When the first node N1 provides the turn-on level to the first output control module 11, optionally, the fourth node N4 may supply the turn-on level to the fifth node N5, such that the second transistor T2 is turned on. Therefore, the signal of the clock signal terminal XCK may be transmitted to the sixth node N6 through the second transistor T2. By the coupling effect of the first capacitor C1, the potential of one terminal of the first capacitor C1 connected to the sixth node N6 may be higher than the potential of another terminal of the first capacitor C1 connected to the gate and the first terminal of the first transistor T1.

When the low-level signal of the first voltage terminal VGL is output through the first output control module 11, since the output signal is a low-level signal, the low-level signal may be coupled to the potential of the first node N1 through the first output control module 11, such that the potential of the first node N1 is lower than the low level signal output from the first voltage terminal VGL. When the potential of the first node N1 is lower than the low-level signal of the first voltage terminal VGL and the potential of the fifth node N5 is the low-level signal, the first transistor T1 may remain in an off state. When the second transistor T2 is turned on and the signal of the second clock signal terminal XCK is a low level signal, by the coupling effect of the first capacitor C1, the potential of the one terminal of the first capacitor C1 connected to the gate of the first transistor T1 may decrease to the first level signal far lower than the low level signal of the first voltage terminal VGL, such that the first transistor T1 is turned on. When the first transistor T1 is turned on, the first level signal may be transmitted to the first node N1, therefore further pulling down the potential of the first node N1. Therefore, the first output control module 11 may be fully turned on, to output the signal of the first voltage terminal VGL through the output terminal OUT and avoid the tailing phenomenon of the output signal.

Figure 5:
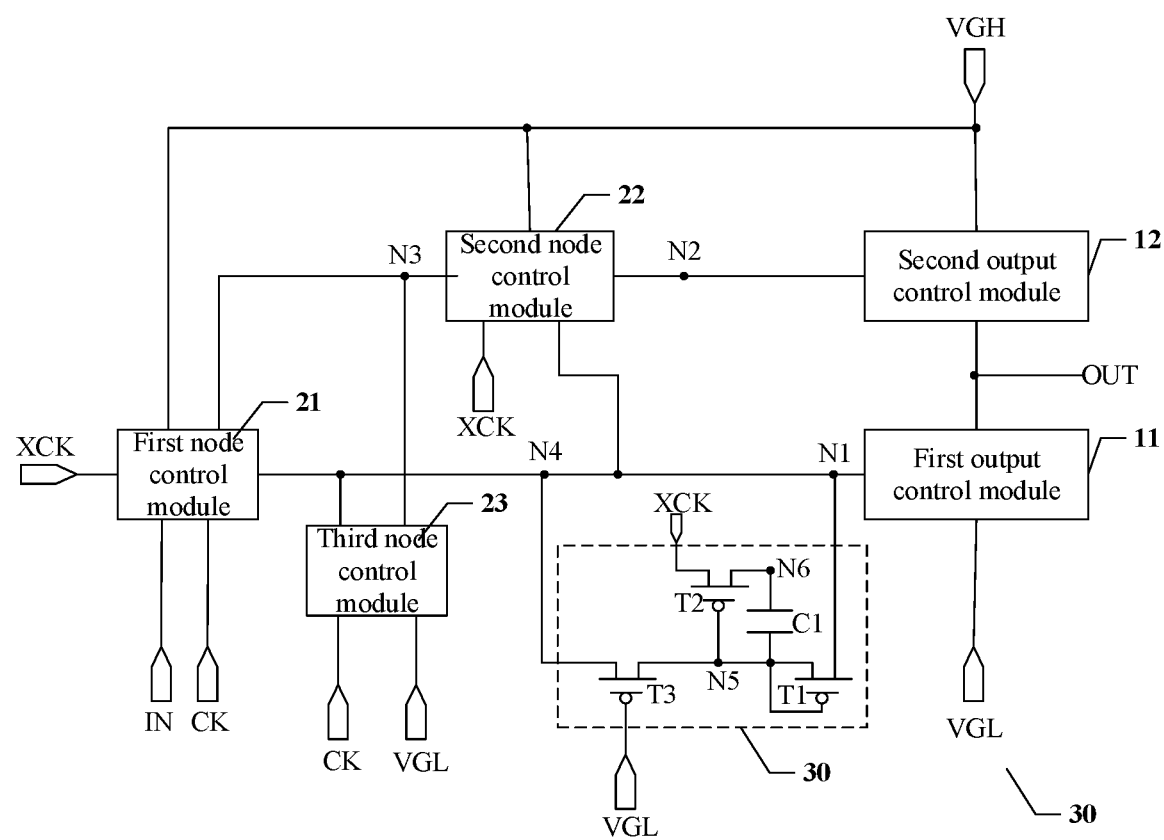
FIG. 5 illustrates another structure of a shift register in a driving circuit consistent with various disclosed embodiments in the present disclosure.

FIG. 5 shows another exemplary structure of the shift register 100 in the driving circuit provided by another embodiment of the present disclosure. The present embodiment provides another first node potential maintaining module 30 in the shift register 100.

As shown in FIG. 5, in one embodiment, the first node potential maintaining module 30 may further include a third transistor T3. A gate of the third transistor T3 may be connected to the first voltage terminal VGL, a first terminal of the third transistor T3 may be connected to the fourth node N4, and the second terminal of the third transistor T3 may be connected to the fifth node N5. Optionally, the first terminal may be a source of the third transistor T3 and the second terminal may be a drain of the third transistor T3.

In the present disclosure, the third transistor T3 may be disposed between the fourth node N4 and the fifth node N5, to limit the direction of the signal. For example, the control electrical signal may only be transmitted from the fourth node N4 to the fifth node N5, but not from the fifth node N5 to the fourth node N4. Considering that the potential of the sixth node N6 may change with the change of the potential of the second clock signal terminal XCK in the first node potential maintaining module 30, the potential of the fifth node N5 may vary with the second clock signal terminal XCK because of the coupling effect of the first capacitor C1. Therefore, when the third transistor T3 is introduced, the potential of the fifth node N5 may be prevented from affecting the potential of the fourth node N4 and then the status of other transistors connected to the fourth node N4. Therefore, the introduction of the third transistor T3 may be beneficial to maintaining the stability of the circuit.

Figure 6:
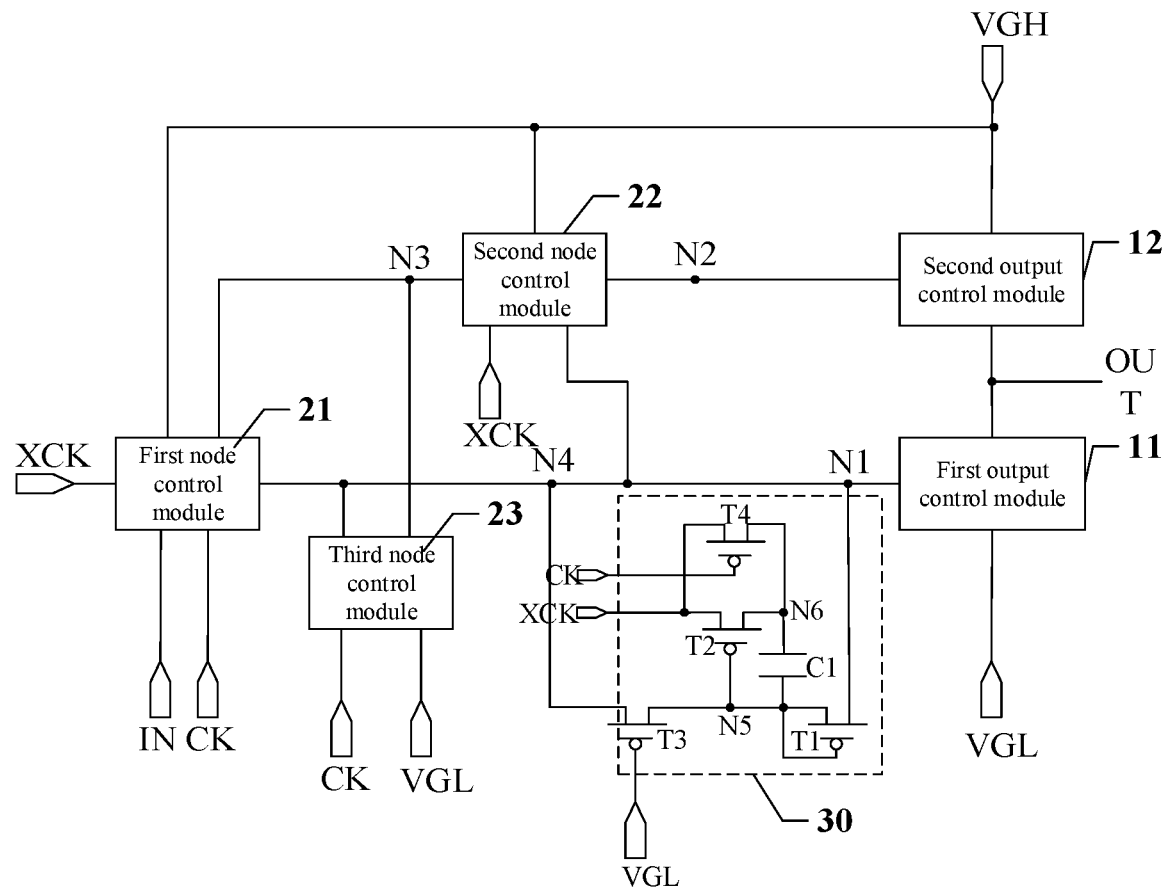
FIG. 6 illustrates another structure of a shift register in a driving circuit consistent with various disclosed embodiments in the present disclosure.

FIG. 6 shows another exemplary structure of the shift register 100 in the driving circuit provided by another embodiment of the present disclosure. The present embodiment in FIG. 6 provides another first node potential maintaining module 30 in the shift register 100.

As shown in FIG. 6, in one embodiment, the first node potential maintaining module 30 may further include a fourth transistor T4. A gate of the fourth transistor T4 may be connected to the first clock signal terminal CK, a first terminal of the fourth transistor T4 may be connected to the second clock signal terminal XCK, and the second terminal of the fourth transistor T4 may be connected to the sixth node N6.

In the present disclosure, the fourth transistor T4 may be disposed between the second clock signal terminal XCK and the sixth node N6. The gate of the fourth transistor T4 may be connected to the first clock signal terminal CK, and may be configured to be turned on in response to the turn-on level of the first clock signal terminal CK. Optionally, the fourth transistor T4 may be a P-type transistor. When the signal of the first voltage terminal VGL connected to the gate of the fourth transistor T4 is a low-level signal, the fourth transistor T4 may be kept in a turn-on state. In some other embodiments, the fourth transistor T4 may be an N-type transistor. Accordingly, the signal connected to the gate may be a high-level signal, such that the fourth transistor T4 is kept in a turn-on state.

When the fourth transistor T4 is turned on, the signal of the second clock signal terminal XCK may be transmitted to the sixth node N6. Since the potential of the fifth node N5 may affect the conduction state of the second transistor T2, and thus affect the signal transmitted from the second clock signal terminal XCK to the sixth node N6 through the second transistor T2. Correspondingly, when the potential of the fifth node N5 changes, the potential transmitted to the sixth node N6 via the second transistor T2 may be unstable. After the fourth transistor T4 is introduced in this embodiment, the fourth transistor T4 may be turned on in response to the turn-on level of the first clock signal terminal CK, and may transmit the signal of the second clock signal terminal XCK to the sixth node N6 after being turned on. This may ensure that when the potential of the fifth node N5 is unstable, the target potential may still be able to be written into the sixth node N6.

Figure 7:
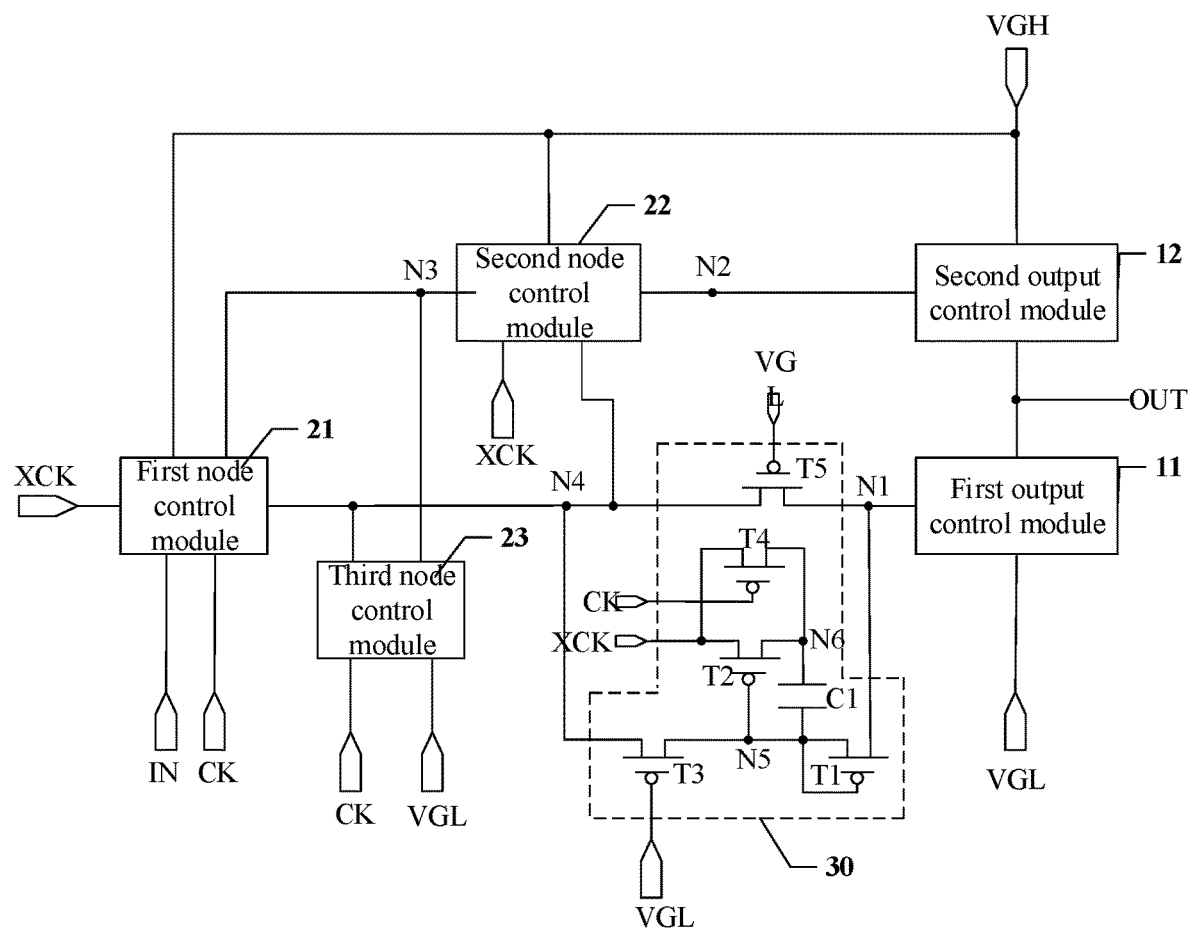
FIG. 7 illustrates another structure of a shift register in a driving circuit consistent with various disclosed embodiments in the present disclosure.

FIG. 7 shows another exemplary structure of the shift register 100 in the driving circuit provided by another embodiment of the present disclosure. The present embodiment in FIG. 7 provides another first node potential maintaining module 30 in the shift register 100.

As shown in FIG. 7, in one embodiment, the first node potential maintaining module 30 may further include a fifth transistor T5. A gate of the fifth transistor T5 may be connected to the first voltage terminal VGL, and a first terminal and a second terminal of the fifth transistor T5 may be connected in series between the fourth node N4 and the first node N1.

In the present disclosure, the fifth transistor T5 may be disposed in the first node potential maintaining module 30. The fifth transistor T5 may be configured to be turned on in response to the signal of the first voltage terminal VGL. The first terminal of the fifth transistor T5 may be connected to the fourth node N4, and the second terminal of the fifth transistor T5 may be connected to the first node N1. Optionally, the first terminal may be a source of the fifth transistor T5 and the second terminal may be a drain of the fifth transistor T5. Optionally, the fourth transistor T4 may be a P-type transistor. When the signal of the first voltage terminal VGL connected to the gate of the fifth transistor T5 is a low-level signal, the fifth transistor T5 may be kept in a turn-on state. In some other embodiments, the fifth transistor T5 may be an N-type transistor. Accordingly, the signal connected to the gate may be a high-level signal, such that the fourth transistor T4 is kept in a turn-on state.

In the present embodiment, the fifth transistor T5 may be introduced to limit the direction of the electrical signal. When the fifth transistor T5 is turned on, the electrical signal may be capable of being transmitted from the fourth node N4 to the first node N1, but not from the first node N1 to the fourth node N4. When the first output control module 11 is turned on, the signal of the first voltage terminal VGL may be output through the first output control module 11. Because of the coupling effect of the first output control module 11, the potential of the first node N1 may change. When the change of the potential of the first node N1 is transmitted to the fourth node N4, the state of the transistors connected to the fourth node N4 and then the stability of the circuit may be affected. Therefore, by introducing the fifth transistor T5 in this embodiment, the transmission of the electrical signal from the first node N1 to the fourth node N4 may be suppressed, thereby ensuring the stability of the potential of the fourth node N4 and further improving the stability of the circuit.

Figure 8:
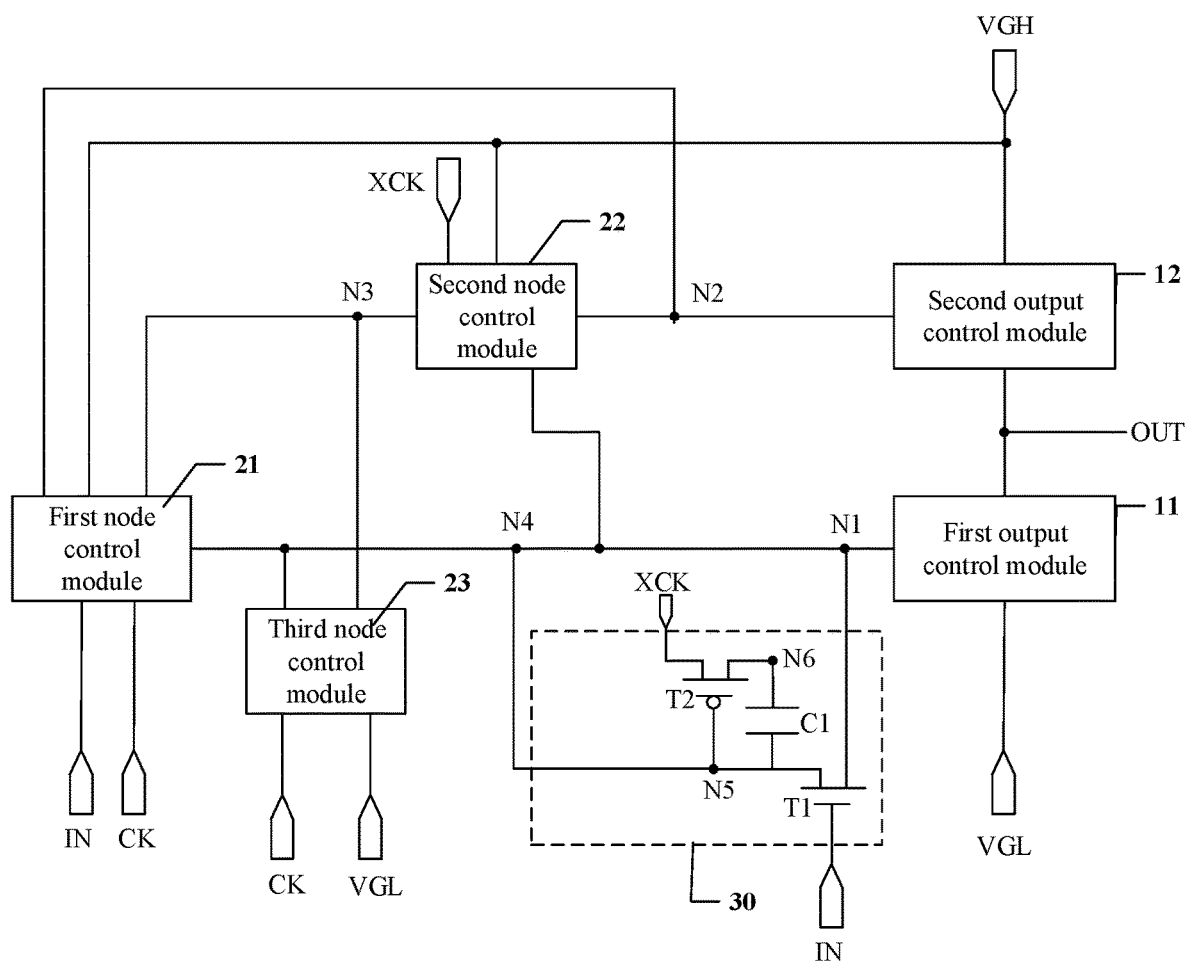
FIG. 8 illustrates another structure of a shift register in a driving circuit consistent with various disclosed embodiments in the present disclosure.

FIG. 8 shows another exemplary structure of the shift register 100 in the driving circuit provided by another embodiment of the present disclosure. The present embodiment in FIG. 8 provides another first node potential maintaining module 30 in the shift register 100.

As shown in FIG. 8, in one embodiment, the first node potential maintaining module 30 may include a first transistor T1, a second transistor T2, and a first capacitor C1. In the first transistor T1, a gate may be connected to the input terminal IN, a first terminal may be connected to the fifth node N5, and the second terminal may be connected to the first node N1. The fifth node N5 may be electrically connected to the fourth node N4. In the second transistor T2, a gate may be connected to the fifth node N5, a first terminal may be connected to the second clock signal terminal XCK, and a second terminal may be connected to the sixth node N6. Two terminals of the first capacitor may be connected to the sixth node N6 and the fifth node N5 respectively. The first transistor T1 may be an oxide transistor.

The present embodiment in FIG. 8 provides another first node potential maintaining module 30 in the shift register 100. In the present embodiment, the first node potential maintaining module 30 may include the first transistor T1, the second transistor T2 and the first capacitor C1. For description purposes only, the embodiment where the second transistor T2 is a P-type transistor is used as an example to illustrate the present disclosure, and does not limit the scope of the present disclosure. In some other embodiments, the second transistor T2 may be an N-type transistor. The present disclosure has no limit on this.

In one embodiment, the first transistor T1 may be an oxide transistor, and the gate of the first transistor T1 may be connected to the input terminal IN. When the input terminal IN is at a low level, the first transistor T1 may be turned off. When the first node N1 provides the turn-on level to the first output control module 11, optionally, the fourth node N4 may supply the turn-on level to the fifth node N5, such that the second transistor T2 is turned on. Therefore, the signal of the clock signal terminal XCK may be transmitted to the sixth node N6 through the second transistor T2. Because of the coupling effect of the first capacitor C1, the potential of the one of the terminals of the first capacitor C1 connected to the sixth node N6 may be higher than another terminal of the first capacitor C1 connected to the gate and the first terminal of the first transistor T1.

When the low-level signal of the first voltage terminal VGL is output through the first output control module 11, since the output signal is a low-level signal, the low-level signal may be coupled to the potential of the first node N1 through the first output control module 11, such that the potential of the first node N1 is lower than the low-level signal output by the first voltage terminal VGL. The low-level signal output by the first output module may have no tailing phenomenon. When the signal of the second clock signal terminal XCK becomes a low-level signal, because of the coupling effect of the first capacitor C1, the potential of one terminal of the first capacitor C1 connected to the fifth node N5 may decrease and become the first level signal much lower than the low level signal of the voltage terminal VGL. The first transistor T1 may be an oxide transistor. The threshold voltage of the oxide transistor may be positive, and the leakage current may be very small. When the potential of the fifth node N5 connected to the first terminal of the first transistor T1 is lower than the potential of the first node N1 connected to the second terminal of the first transistor T1 and the input terminal IN connected to the gate of the first transistor N1 has a low-level signal, the first transistor T1 may be turned on and the first-level signal may be transmitted to the first node N1 through the first transistor T1, such that the potential of the first node N1 may be further pulled down and the first output control module 11 may still be fully turned on. Therefore, the signal of the first voltage terminal VGL may be output through the output terminal OUT to prevent the output signal from the trailing phenomenon.

Figure 9:
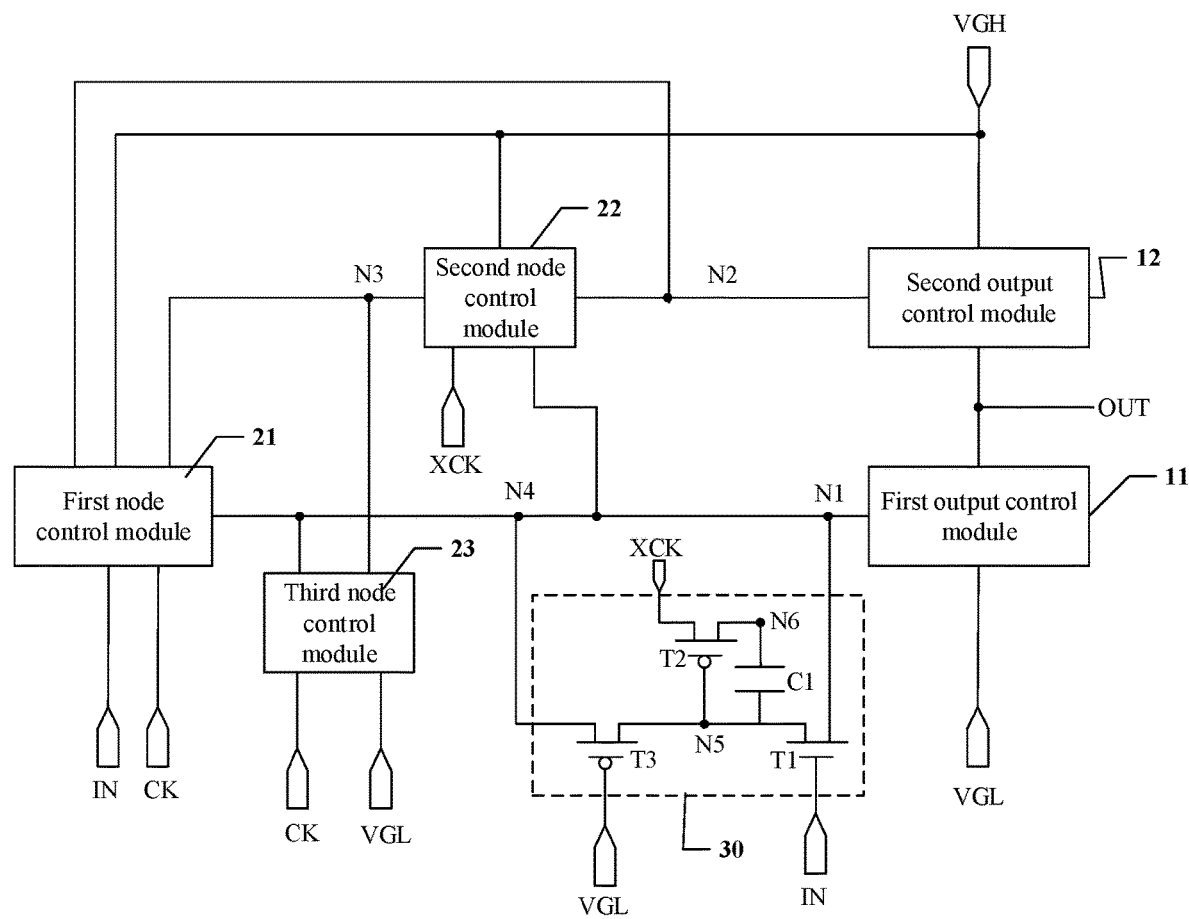
FIG. 9 illustrates another structure of a shift register in a driving circuit consistent with various disclosed embodiments in the present disclosure.

FIG. 9 shows another exemplary structure of the shift register 100 in the driving circuit provided by another embodiment of the present disclosure. The present embodiment in FIG. 9 provides another first node potential maintaining module 30 in the shift register 100.

As shown in FIG. 9, in one embodiment, the first node potential maintaining module 30 may further include a third transistor T3. A gate of the third transistor T3 may be connected to the first voltage terminal VGL, a first terminal of the third transistor T3 may be connected to the fourth node N4, and the second terminal of the third transistor T3 may be connected to the fifth node N5.

In the present embodiment, the first transistor T1 in the first node potential maintaining module 30 may be an oxide transistor and the third transistor T3 may be disposed between the fourth node N4 and the fifth node N5 to limit the direction of the signal. For example, the control electrical signal may only be transmitted from the fourth node N4 to the fifth node N5, but not from the fifth node N5 to the fourth node N4. Considering that the potential of the sixth node N6 may change with the change of the potential of the second clock signal terminal XCK in the first node potential maintaining module 30, the potential of the fifth node N5 may vary with the second clock signal terminal XCK because of the coupling effect of the first capacitor C1. Therefore, when the third transistor T3 is introduced, the potential of the fifth node N5 may be prevented from affecting the potential of the fourth node N4 and then the status of other transistors connected to the fourth node N4. Therefore, the introduction of the third transistor T3 may be beneficial to maintain the stability of the circuit.

Figure 10:
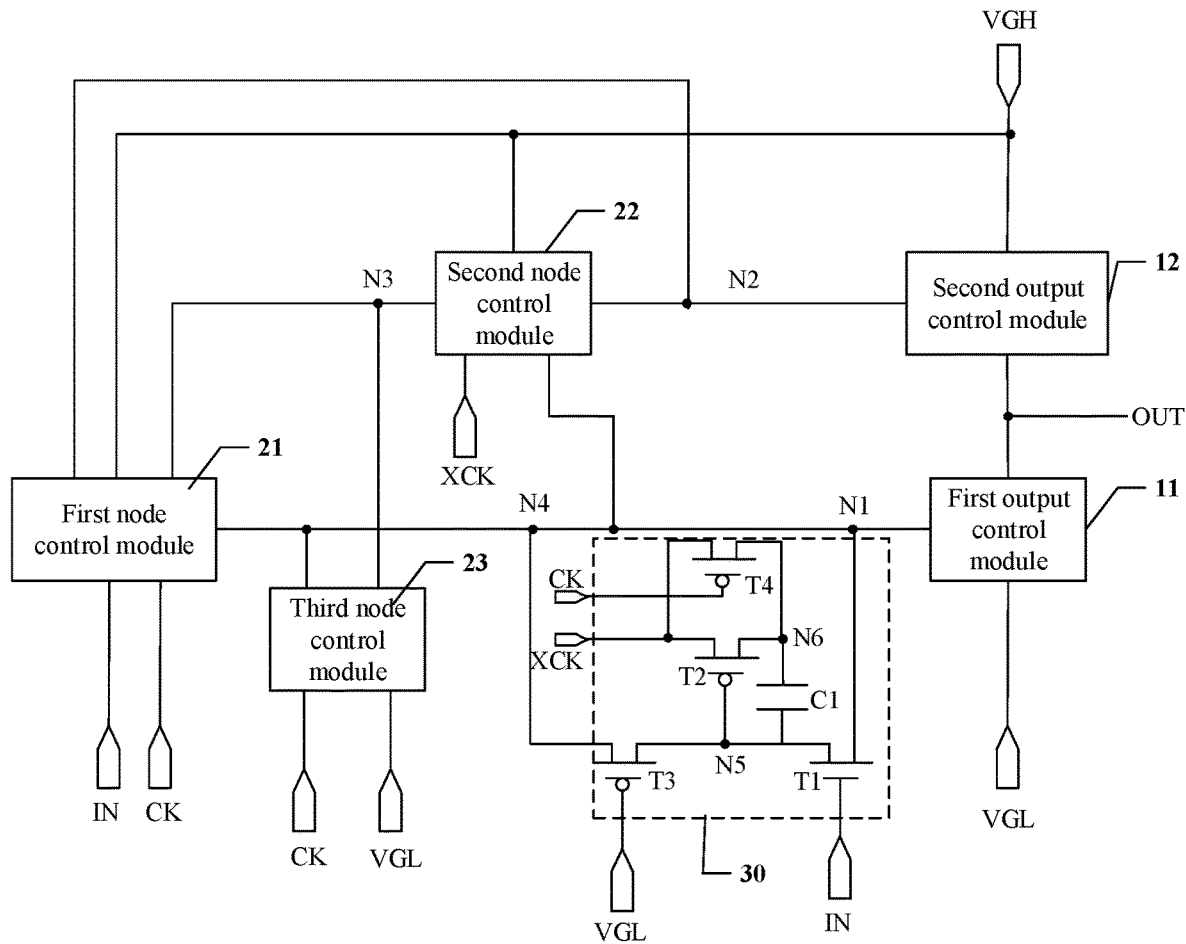
FIG. 10 illustrates another structure of a shift register in a driving circuit consistent with various disclosed embodiments in the present disclosure.

FIG. 10 shows another exemplary structure of the shift register 100 in the driving circuit provided by another embodiment of the present disclosure. The present embodiment in FIG. 10 provides another first node potential maintaining module 30 in the shift register 100.

As shown in FIG. 10, in one embodiment, the first node potential maintaining module 30 may further include a fourth transistor T4. A gate of the fourth transistor T4 may be connected to the first clock signal terminal CK, a first terminal of the fourth transistor T4 may be connected to the second clock signal terminal XCK, and the second terminal of the fourth transistor T4 may be connected to the sixth node N6.

In the present embodiment, the first transistor T1 in the first node potential maintaining module 30 may be an oxide transistor and the fourth transistor T4 may be disposed between the second clock signal terminal XCK and the sixth node N6. The gate of the fourth transistor T4 may be connected to the first clock signal terminal CK, and may be configured to be turned on in response to the turn-on level of the first clock signal terminal CK. Optionally, the fourth transistor T4 may be a P-type transistor. When the signal of the first voltage terminal VGL connected to the gate of the fourth transistor T4 is a low-level signal, the fourth transistor T4 may be kept in a turn-on state. In some other embodiments, the fourth transistor T4 may be an N-type transistor. Accordingly, the signal connected to the gate may be a high-level signal, such that the fourth transistor T4 is kept in a turn-on state.

When the fourth transistor T4 is turned on, the signal of the second clock signal terminal XCK may be transmitted to the sixth node N6. Since the potential of the fifth node N5 may affect the conduction state of the second transistor T2, and thus affect the signal transmitted from the second clock signal terminal XCK to the sixth node N6 through the second transistor T2. Correspondingly, when the potential of the fifth node N5 changes, the potential transmitted to the sixth node N6 via the second transistor T2 may be unstable. After the fourth transistor T4 is introduced in this embodiment, the fourth transistor T4 may be turned on in response to the turn-on level of the first clock signal terminal CK, and may transmit the signal of the second clock signal terminal XCK to the sixth node N6 after being turned on. This may ensure that when the potential of the fifth node N5 is unstable, the target potential may still be able to be written into the sixth node N6.

Figure 11:
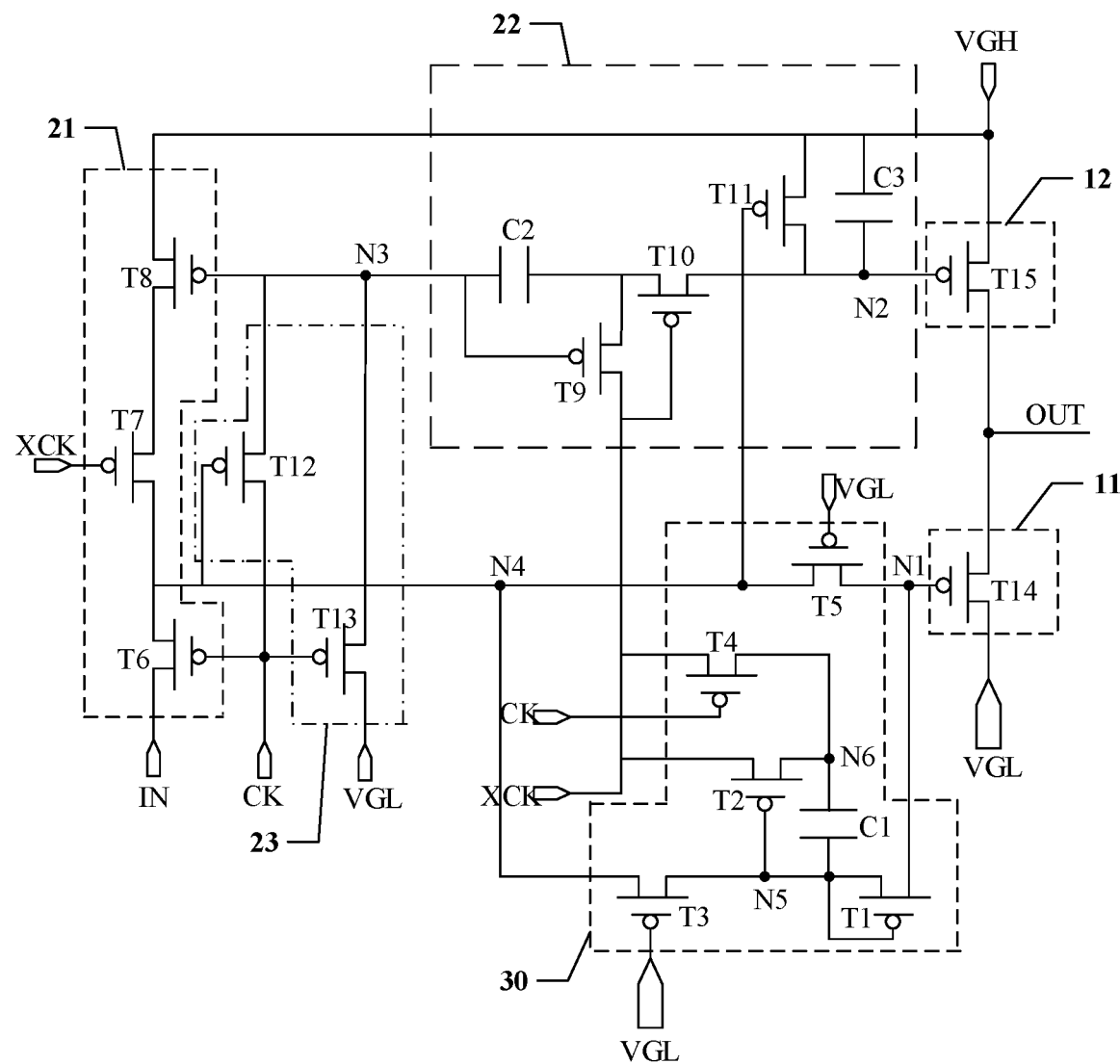
FIG. 11 illustrates a circuit schematic diagram of a shift register in a driving circuit consistent with various disclosed embodiments in the present disclosure.

FIG. 11 shows a circuit schematic of the shift register 100 in the driving circuit provided by one embodiment of the present disclosure. The present embodiment in FIG. 11 shows detailed circuit structures of various modules in the shift register 100. The embodiment in FIG. 11 only shows an exemplary circuit structure of the first node potential maintaining module 30, and should not limit the scope of the present disclosure. In some other embodiments, the circuit structure of the first node potential maintaining module 30 may adopt other structures in FIG. 4, FIG. 5 or FIG. 6. The present disclosure has no limit on this.

As shown in FIG. 11, in one embodiment, the first node control module 21 may include a sixth transistor T6, a seventh transistor T7 and an eighth transistor T8. In the sixth transistor T6, a gate may be connected to the first clock signal terminal CK, a first terminal may be connected to the input terminal IN, and the second terminal may be connected to the fourth node N4. In the seventh transistor T7, a gate may be connected to the second clock signal terminal XCK, and a first terminal may be connected to a second terminal of the eighth transistor T8, and a second terminal may be connected to the fourth node N4. In the eighth transistor T8, a gate may be connected to the third node N3 and a first terminal may be connected to the second voltage terminal VGH.

For description purposes only, the embodiment where the sixth transistor T6, the seventh transistor T7, and the eighth transistor T8 in the first node control module 21 are all P-type transistors is used as an example to illustrate the present disclosure, and should not limit the scope of the present disclosure. In some other embodiment, the sixth transistor T6, the seventh transistor T7, or the eighth transistor T8 may be N-type transistors. The present disclosure has no limit on this.

In one embodiment, in the first node control module 21, gates of the sixth transistor T6, the seventh transistor T7 and the eighth transistor T8 may be connected to different signal terminals. Second terminals of the sixth transistor T6 and the seventh transistor T7 may be both coupled to the first node N1. When the first clock signal terminal CK provides the turn-on level to the sixth transistor T6, the signal of the input terminal IN may be transmitted to the first node N1 through the sixth node N6. When the seventh transistor T7 is turned on in response to the turn-on signal of the second clock signal terminal XCK and the eighth transistor T8 is turned on in response to the turn-on level of the third node N3, the signal of the second voltage terminal VGH may be transmitted to the first node N1 through the eighth transistor T8 and the seventh transistor T7. Optionally, the signal transmitted to the first node N1 via the eighth transistor T8 and the seventh transistor T7 may be a high-level signal, and the first output control module 11 may be in a turn-off state. Optionally, when the signal transmitted to the first node N1 via the sixth transistor T6 is a low level signal, the first output control module 11 may be turned on, and the signal of the first voltage terminal VGL may be output through the first output control module 11. Correspondingly, the control of the potential of the first node N1 may be realized through the cooperation of the three transistors.

Figure 12:
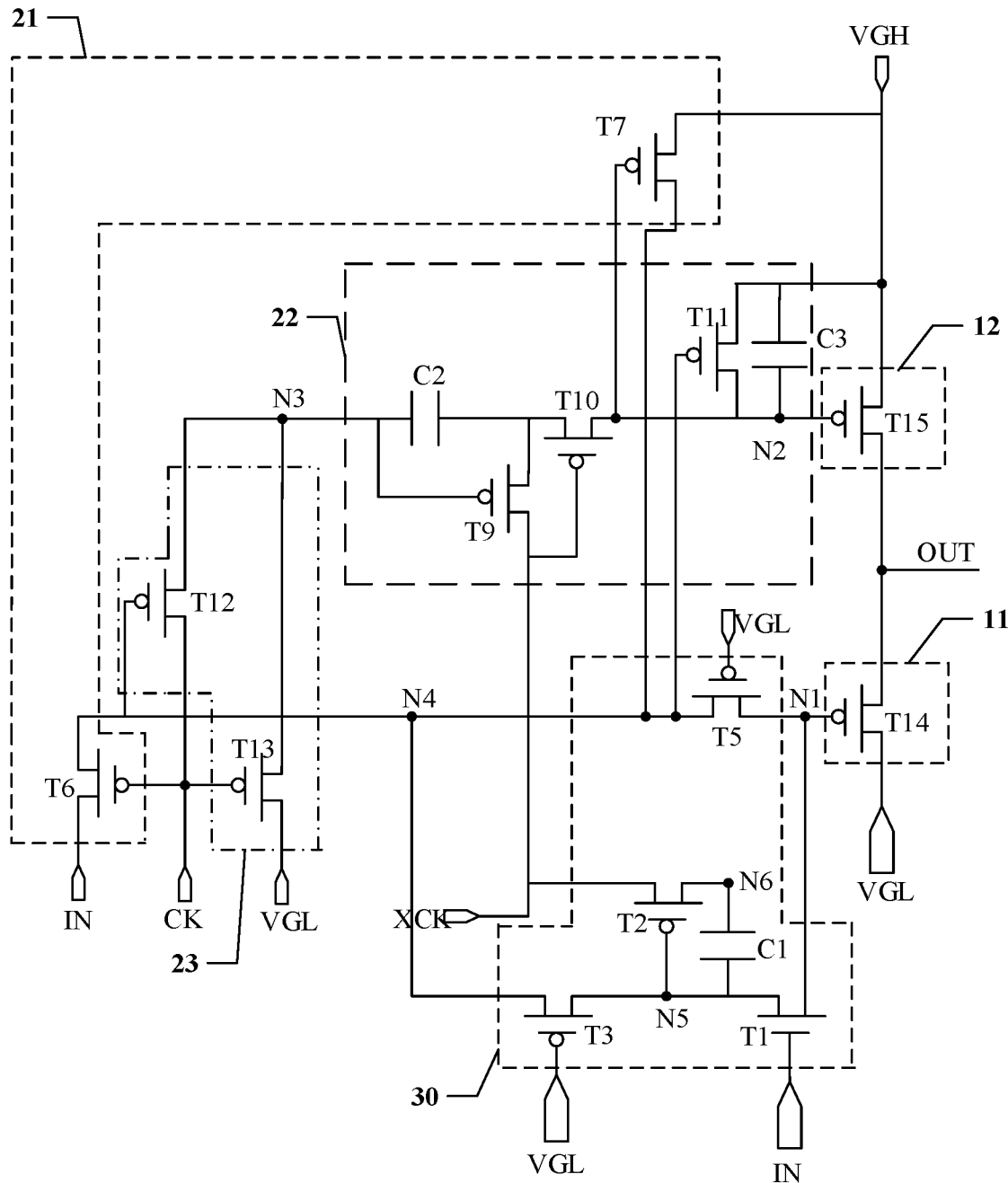
FIG. 12 illustrates another circuit schematic diagram of a shift register in a driving circuit consistent with various disclosed embodiments in the present disclosure.

The embodiment with the first node control module 21 for controlling the potential of the first node N1 shown in FIG. 11 is only used as an example to illustrate the present disclosure, and does not limit the scope of the present disclosure. In some other embodiments, the first node control module 21 may adopt other suitable structures for controlling the potential of the first node N1. For example, one embodiment in FIG. 12 provides another shift register 100 in the driving circuit. FIG. 12 illustrates a circuit schematic of the shift register 100 in the driving circuit, showing detailed circuit structures of various modules in the shift register 100. The embodiment in FIG. 12 only shows an exemplary circuit structure of the first node potential maintaining module 30 where the first transistor T1 is an oxide transistor, and should not limit the scope of the present disclosure. In some other embodiments, the circuit structure of the first node potential maintaining module 30 may adopt other structures in FIG. 8, FIG. 9 or FIG. 10. The present disclosure has no limit on this. In some other embodiments, the circuit structure of the first node potential maintaining module 30 may adopt other structures in FIG. 4, FIG. 11, FIG. 5 or FIG. 6.

As shown in FIG. 12, in one embodiment, the first node control module 21 may include a sixth transistor T6 and a seventh transistor T7. In the sixth transistor T6, a gate may be connected to the first clock signal terminal CK, a first terminal may be connected to the input terminal IN, and the second terminal may be connected to the fourth node N4. In the seventh transistor T7, a gate may be connected to the second node N2, and a first terminal may be connected to a second voltage terminal VGH, and a second terminal may be connected to the first node N1.

For description purposes only, the embodiment where the sixth transistor T6 and the seventh transistor T7 in the first node potential maintaining module 21 are P-type transistors is used as an example to illustrate the present disclosure, and should not limit the scope of the present disclosure. In some other embodiment, the sixth transistor T6 and the seventh transistor T7 may be N-type transistors. The present disclosure has no limit on this.

In one embodiment, in the first node control module 21, the gates of the sixth transistor T6 and the seventh transistor T7 may be connected to different signal terminals. The second terminals of the sixth transistor T6 and the seventh transistor T7 may be both coupled to the first node N1. When the first clock signal terminal CK provides the turn-on level to the sixth transistor T6, the signal of the input terminal IN may be transmitted to the first node N1 through the sixth node N6. Optionally, when the signal transmitted to the first node N1 via the sixth transistor T6 is a low level signal, the first output control module 11 may be turned on, and the signal of the first voltage terminal VGL may be output through the first output control module 11. When the turn-on level of the second node N2 is transmitted to the seventh transistor T7, the seventh transistor T7 may be turned on and the high-level signal of the second voltage terminal VGH may be transmitted to the first node N1, such that the first output control module 11 may be in a turn-off state. Correspondingly, the control of the potential of the first node N1 may be realized through the cooperation of the two transistors.

In one embodiment shown in FIG. 11 or FIG. 12, the second node control module 22 may include a ninth transistor T9, a tenth transistor T10, an eleventh transistor T11, a second capacitor C2, and a third capacitor C3. In the ninth transistor T9, a gate may be connected to the third node N3, and a first terminal may be connected to the second clock signal terminal XCK. The second capacitor C2 may be coupled between a second terminal and the gate of the ninth transistor T9. In the tenth transistor T10, a gate may be connected to the second clock signal terminal XCK, a first terminal may be connected to the first terminal of the nine transistors T9, and a second terminal may be connected to the second node N2. In the eleventh transistor T11, a gate may be connected to the fourth node N4, a first terminal may be connected to the second voltage terminal VGH, and a second terminal may be connected to the second node N2. The third capacitor C3 may be coupled between the second voltage terminal VGH and the second node N2.

For description purposes only, the embodiment where the ninth transistor T9, the tenth transistor T10, and the eleventh transistor T11 in the second node control module 22 are all P-type transistors is used as an example to illustrate the present disclosure, and should not limit the scope of the present disclosure. In some other embodiment, the ninth transistor T9, the tenth transistor T10, or the eleventh transistor T11 may be N-type transistors. The present disclosure has no limit on this.

In the present embodiment, the second node control module 22 may include three transistors and two capacitors, specifically the ninth transistor T9, the tenth transistor T10, the eleventh transistor T11, the second capacitor C2 and the third capacitor C3. The gates of the three transistors may respectively be connected to different signal terminals. The eleventh transistor T11 may be turned on in response to the turn-on level of the first node N1, such that the signal of the second voltage terminal VGH may be transmitted to the second node N2. The ninth transistor T9 may be turned on in response to the turn-on level of the third node N3, and the tenth transistor T10 may be turned on in response to the turn-on level of the second clock signal terminal XCK, such that the signal of the second clock signal terminal XCK may be transmitted to the second node N2 through the ninth transistor T9 and the tenth transistor T10. One of the signals transmitted to the second node N2 through the eleventh transistor T11 and the signal transmitted to the second node N2 through the ninth transistor T9 and the tenth transistor T10 may be configured to control the second output control module 12 to be turned on, and another may control the second output control module 12 to be turned off.

In this embodiment, the second capacitor C2 and the third capacitor C3 may be introduced into the second node control module 22. The second capacitor C2 may be used to maintain the potential of the third node N3, and the third capacitor C3 may be used to maintain the voltage of the second node N2. Therefore, the turn-on or turn-off state of the second output control module 12 may be more stable.

For description purposes only, the embodiments with the second node control module 22 including three transistors and two capacitors shown in FIG. 11 and FIG. 12 are used as examples to illustrate the present disclosure, and should not limit the scope of the present disclosure. In some other embodiments of the present disclosure, the second node control module 22 may adopt other feasible structures which are not specifically limited in the present disclosure.

As shown in FIG. 11 and FIG. 12, in one embodiment, the third node control module 23 may include a twelfth transistor T12 and a thirteenth transistor T13. A gate of the twelfth transistor T12 may be connected to the fourth node N4, and the first terminal of the twelfth transistor T12 may be connected to the third node N3. A second terminal of the twelfth transistor T12 and a gate of the thirteenth transistor T13 may be both connected to the first clock signal terminal CK. A first terminal of the thirteenth transistor T13 may be connected to the first voltage terminal VGL, and a second terminal of the thirteenth transistor T13 may be connected to the third node N3.

For description purposes only, the embodiment where the twelfth transistor T12 and the thirteenth transistor T13 in the third node control module 23 are all P-type transistors is used as an example to illustrate the present disclosure, and should not limit the scope of the present disclosure. In some other embodiment, the twelfth transistor T12 or the thirteenth transistor T13 may be N-type transistors. The present disclosure has no limit on this.

In the present embodiment, the third node control module 23 may include the twelfth transistor T12 and the thirteenth transistor T13. The gate of the twelfth transistor T12 may be turned on in response to the turn-on level of the fourth node N4. When the twelfth transistor T12 is turned on, the signal of the first clock signal terminal CK may be transmitted to the third node N3 through the second transistor T2. The thirteenth transistor T13 may be turned on in response to the turn-on level of the first clock signal terminal CK. When the thirteenth transistor T13 is turned on, the signal of the first voltage terminal VGL may be transmitted to the third node N3 through the thirteenth transistor T13 and the signal transmitted to the third node N3 at this time may be a low-level signal.

For description purposes only, the embodiments with the third node control module 22 including two transistors shown in FIG. 11 and FIG. 12 are used as examples to illustrate the present disclosure, and should not limit the scope of the present disclosure. In some other embodiments of the present disclosure, the third node control module 23 may adopt other feasible structures which are not specifically limited in the present disclosure.

As shown in FIG. 11 and FIG. 12, in one embodiment, the first output control module 11 may include a fourteenth transistor T14. In the fourteenth transistor T14, a gate may be connected to the first node N1, a first terminal may be connected to the first voltage terminal VGL, and a second terminal may be connected to the output terminal OUT.

For description purposes only, the embodiment where the fourteenth transistor T14 in the first output control module 11 is a P-type transistor is used as an example to illustrate the present disclosure, and should not limit the scope of the present disclosure. In some other embodiment, the fourteenth transistor T14 may be an N-type transistor. The present disclosure has no limit on this.

In the shift register 100 provided by the present embodiment, the fourteenth transistor T14 may be turned on in response to the turn-on level of the first node N1. In this embodiment, when the first node N1 is a low-level signal, the fourteenth transistor T14 may be turned on, and the signal of the first voltage terminal VGL may be transmitted to the output terminal OUT through the fourteenth transistor T14. In the present embodiment, one transistor may be used to form the first output control module 11, which is beneficial to simplifying the circuit structure of the driving circuit.

As shown in FIG. 11 and FIG. 12, in one embodiment, the second output control module 12 may include a fifteenth transistor T15. In the fifteenth transistor T15, a gate may be connected to the second node N2, a first terminal may be connected to the second voltage terminal VGH, and a second terminal may be connected to the output terminal OUT.

For description purposes only, the embodiment where the fifteenth transistor T15 in the first output control module 11 is a P-type transistor is used as an example to illustrate the present disclosure, and should not limit the scope of the present disclosure. In some other embodiment, the fifteenth transistor T15 may be an N-type transistor. The present disclosure has no limit on this.

In the shift register 100 provided by the present embodiment, the fifteenth transistor T15 may be turned on in response to the turn-on level of the second node N2. In this embodiment, when the second node N2 is a low-level signal, the fifteenth transistor T15 may be turned on, and the signal of the second voltage terminal VGH may be transmitted to the output terminal OUT through the fifteenth transistor T15. In the present embodiment, one transistor may be used to form the second output control module 12, which is beneficial to simplifying the circuit structure of the driving circuit.

Optionally, in one time, only one of the fourteenth transistor T14 and the fifteenth transistor T15 may be turned on, that is, only one of the fourteenth transistor T14 and the fifteenth transistor T15 may output signals.

In one embodiment of the present disclosure, the driving circuit may be a gate driving circuit.

When the driving circuit of the present disclosure is a gate driving circuit in a display panel, the output terminal OUT of the gate driving circuit may be used to connect scan lines in the display panel. In practical applications, the gate driving circuit may control sub-pixels in the display panel to be turned on row by row. Since the present disclosure introduces the first node potential maintaining module 30 into the shift register 100 of the gate driving circuit, the first node potential may be pulled down when the first output control module 11 outputs the signal of the first voltage terminal VGL, to ensure that the first output control module 11 is fully turned on and suppress the output tailing phenomenon. The display effect may be improved.

Figure 13:
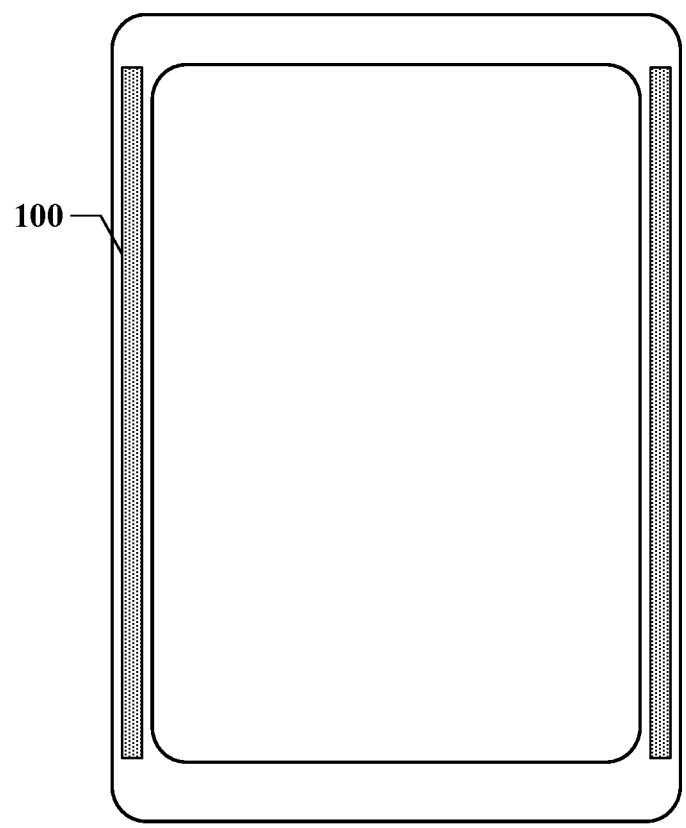
FIG. 13 illustrates a structural schematic diagram of a display panel consistent with various disclosed embodiments in the present disclosure.

The present disclosure also provides a display panel. As shown in FIG. 13 which illustrates an exemplary display panel provided by one embodiment of the present disclosure, the display panel may include a driving circuit provided by above embodiments of the present disclosure.

As shown in FIG. 13, the display panel may include a display area and a non-display area. For description purposes only, the embodiment in FIG. 13 with the driving circuit provided on both sides of the display area is used as an example to illustrate the present disclosure, and does not limit the scope of the present disclosure. For example, the sub-pixels in the display panel may be driven in a bilateral driving manner. In some other embodiments of the present disclosure, the driving circuit may be provided only on one side of the display area to drive the sub-pixels in the display panel in a unilateral driving manner, which is not specifically limited in the present disclosure.

As shown in FIG. 1 to FIG. 13, the first node potential maintaining module 30 may be disposed in the shift register 100 of the driving circuit in the display panel provided by the embodiments of the present disclosure. When the first output control module 11 is turned on and the signal of the first voltage terminal VGL is output through the first output control module 11, the first node potential maintaining module 30 may be controlled to transmit the first level signal with a smaller voltage value to the first node N1, to pull down the potential of the first node N1. When the potential of the first node N1 is pulled down, the threshold loss of the first node N1 may be compensated. After the threshold value of the first node N1 is compensated, it may be beneficial to maintain the turn-on state of the first output control module 11 in a constant state such that the first output control module 11 is fully turned on. Therefore, the first output control module 11 may constantly output the signal of the first voltage terminal VGL from the first output control module 11 to avoid the tailing phenomenon, and the display effect of the display panel may be improved.

The present disclosure also provides a driving method of a driving circuit. In one embodiment as shown in FIG. 1 to FIG. 11, the driving circuit may include at least two shift registers 100 in cascade. Each shift register 100 of the at least two shift registers 100 may include an input terminal IN, an output terminal OUT, a first voltage terminal VGL, a second voltage terminal VGH, a first clock signal terminal CK, a second clock signal terminal XCK, a first output control module 11, a second output control module 12, a first node control module 21, a second node control module 22, a third node control module 23, and a first node potential maintaining module 30.

The first output control module 11 may be configured to transmit a voltage of the first voltage terminal VGL to the output terminal OUT in response to a turn-on electrical level of the first node N1.

The second output control module 12 may be configured to transmit a voltage of the second voltage terminal VGH to the output terminal OUT in response to a turn-on electrical level of the second node N2.

The first node control module 21 may be configured to transmit a voltage of the input terminal IN to the first node N1 in response to a turn-on electrical level of the first clock signal terminal CK, and transmit a voltage of the second voltage terminal VGH to the first node N1 in response to turn-on electrical levels of the second clock signal terminal XCK and the third node N3 or in response to a turn-on electrical level of the second node N2.

The second node control module 22 may be configured to transmit a voltage of the second voltage terminal VGH to the second node N2 in response to a turn-on electrical level of the first node N1, and transmit a voltage of the second clock signal terminal XCK to the second node N2 in response to turn-on electrical levels of third node N3 and the second clock signal terminal XCK.

The third node control module 23 is configured to transmit the voltage of the first voltage terminal VGL to the third node N3 in response to the turn-on electrical level of the first clock signal terminal CK, and transmit the voltage of the first clock signal terminal CK to the third node N3 in response to the turn-on electrical level of the first node N1.

The first node potential maintaining module 30 may be electrically connected to the fourth node N4 with the first node control module 21, and may be connected in series between the fourth node N4 and the first node N1.

As shown in FIG. 14 which illustrates a flowchart of the driving method of the driving circuit, in one embodiment, the driving method may include a first output stage and a first node voltage maintaining state.

As shown in FIG. 1 to FIG. 11, in the first output stage, the first node control module 21 may transmit the voltage of the input terminal IN to the first node N1, in response to the turn-on level of the first clock signal terminal CK, such that the first output control module 11 is turned on and the signal of the first voltage terminal VGL is output through the output terminal OUT.

In the first node voltage maintaining stage, the first node potential maintaining module 30 may transmit the signal of the input terminal IN to the fourth node N4 in response to the turn-on level of the first clock signal terminal CK, and may transmit the first level signal to the first node N1 in response to the signal of the fourth node N4 and the signal of the second clock signal terminal XCK or in response to the signals of the input terminal IN, the fourth node N4 and the second clock signal terminal XCK. The voltage of the first level signal may be lower than the voltage of the first voltage terminal VGL.

As shown in FIG. 1 to FIG. 12 and FIG. 14, in the present disclosure, the driving method of the driving circuit may include the first output stage and the first node voltage maintaining state after the first output stage. In the first output stage, the first output control module 11 may be turned on, and the signal of the first voltage terminal VGL may be transmitted to the output terminal OUT through the first output control module 11. In one embodiment shown in FIG. 11 and FIG. 12, when the first clock signal terminal CK outputs a low level, the sixth transistor T6 in the first node control module 21 may be turned on to transmit the low level signal of the input terminal IN to the first node N1, such that the fourteenth transistor T14 in the first output control module 11 is turned on and the low-level signal of the first voltage terminal VGL is output to the output terminal OUT through the fourteenth transistor T14. At the same time, the signal of the input terminal IN may be transmitted to the fourth node N4, the signal of the fourth node N4 may be transmitted to the fifth node N5, and the second transistor T2 is controlled to be turned on, such that the signal of the second clock signal terminal XCK is transmitted to the sixth node N6. In the first node potential maintenance stage, when the signal of the second clock signal terminal XCK changes from a high-level signal to a low-level signal, the potential of the sixth node N6 may decrease. Because of the coupling effect of the first capacitor C1, the potential of the fifth node N5 may also decrease to a first level signal lower than the voltage of the first voltage terminal VGL. In the embodiment of FIG. 11 where the gate of the first transistor T1 is connected to the fifth node T5 and in the embodiment of FIG. 12 where the first transistor T1 is an oxide transistor, when the potential of the fifth node N5 becomes the first level signal, the first transistor T1 in FIG. 11 and FIG. 12 may be turned on, and the first level signal corresponding to the fifth node N5 may be transmitted to the first node N1 through the first transistor T1 and the potential of the first node N1 may be pulled down. When the potential of the first node N1 is pulled down, the threshold loss of the first node N1 may be compensated. After the threshold value of the first node N1 is compensated, it may be beneficial to maintain the turn-on state of the first output control module 11 in a constant state, such that the first output control module 11 is fully turned on and is able to constantly output the signal of the first voltage terminal VGL from the first output control module 11. The tailing phenomenon may be suppressed, and the display effect of the display panel may be improved.

In one embodiment shown in FIG. 2 and FIG. 11 or one embodiment shown in FIG. 3 and FIG. 12, the first node potential maintaining module 30 may include the first transistor T1, the second transistor T2 and the first capacitor C1. The gate of the first transistor T1 may be connected to a first terminal of the first transistor T1 and may be further coupled and connected to the fifth node N5. Or the first transistor T1 may be an oxide transistor, and the gate may be connected to the input terminal N1 and the first terminal may be connected to the fifth node N5. The second terminal of the first transistor T1 may be connected to the first node N1. The fifth node N5 may be electrically connected to the fourth node N4. The gate of the second transistor T2 may be connected to the fifth node N5. The first terminal of the second transistor T2 may be connected to the second clock signal terminal XCK, and the second terminal of the second transistor T2 may be connected to the sixth node N6. Two terminals of the first capacitor C1 may be respectively connected to the sixth node N6 and the first terminal of the first transistor T1.

In the first output stage, the first transistor T1 may be turned off, and the signal of the input terminal IN may be transmitted to the fifth node N5 via the fourth node N4, to control the second transistor T2 to be turned on. The signal of the second clock signal terminal XCK may be transmitted to the sixth node N6. The potential of one terminal in the first capacitor C1 connected to the sixth node N6 may be higher than the potential of another terminal connected to the gate and the first terminal of the first transistor T1.

For description purposes only, the embodiment shown in FIG. 11 and FIG. 12 where the transistors in the first node control module 21 and the first node potential maintaining module 30 are P-type transistors is used as an example to illustrate the present disclosure, and does not limit the scope of the present disclosure. In some other embodiments, t the transistors in the first node control module 21 and the first node potential maintaining module 30 may be N-type transistors. The present disclosure has no limit on this.

In the first output stage, the first node N1 may be at low level, and the fourteenth transistor T14 in the first output control module 11 may be turned on, such that the low level signal of the first voltage terminal VGL is transmitted to the output terminal OUT. Because of the coupling effect of the fourteenth transistor T14, the potential of the first node N1 may decrease, such that the potential of the first node N1 is much lower than the potential of the first voltage terminal VGL and the fourteenth transistor T14 is completely turned on. Therefore, the signal output by the fourteenth transistor T14 may be prevented from the tailing phenomenon.

At the same time, in the first output stage, the first clock signal terminal CK may be at a low level, and the input terminal IN may be also at a low level. At this time, the sixth transistor T6 may be turned on. The low level signal of the input terminal IN may be transmitted to the fourth node N4 and then transmitted to the fifth node N5, such that the second transistor T2 is turned on and the high-level signal of the second clock signal terminal XCK is transmitted to the sixth node N6. Because of the coupling effect of the first capacitor C1, the potential of the sixth node N6 may be higher than that of the gate and the first terminal of the first transistor T1. When the fifth node N5 is at a low level, since the potential of the first node N1 is lower than the low level signal of the first voltage terminal VGL, the potential of the first node N1 may also be lower than the low level potential of the fifth node N5, such the first transistor T1 is turned off.

As shown in FIG. 11 and FIG. 12, in one embodiment, in the first node potential maintaining stage, the second clock signal terminal XCK may change from a high-level signal to a low-level signal, and transmit the low-level signal to the sixth node N6. The potential of the fifth node N5 may decrease to the first level signal because of the coupling effect of the first capacitor C1, such that the first transistor T1 is turned on to transmit the first level signal to the first node N1.

When the first node potential maintaining module 30 is not introduced, when the potential of the first node N1 increases gradually, the turn-on state of the fourteenth transistor T14 may be affected, and the phenomenon of output tailing may occur. In the present disclosure, the first node potential maintaining module 30 may be disposed. In the first node potential maintaining stage, the signal of the second clock signal terminal XCK may change from high level to low level, and transmit the low level signal to the sixth node N6. Because of the coupling effect of the first capacitor C1, the potential of the gate and the first terminal of the first transistor T1 may decrease accordingly to the first level signal lower than the low level signal of the first voltage terminal VGL, to turn on the first transistor T1. At this time, the first level signal may be transmitted to the first node N1, and the potential of the first node N1 may be further pulled down to ensure that the fourteenth transistor T14 can still be fully turned on. Therefore, it may be ensured that the signal of the first voltage terminal VGL is smoothly output, effectively suppress the the output tailing phenomenon. The display effect may be improved.

As shown in FIG. 11 and FIG. 12, in one embodiment, the first node potential maintaining module 30 may further include the fourth transistor T4. The gate of the fourth transistor T4 may be connected to the first clock signal terminal CK, the first terminal may be connected to the second clock signal terminal XCK, and the second terminal the fourth transistor T4 may be connected to the sixth nodes N6. In the first node potential maintaining stage, the fourth transistor T4 may be turned on in response to the signal of the first clock signal terminal CK, and the signal of the second clock signal terminal XCK may be transmitted from the fourth transistor T4 to the sixth node N6.

Specifically, in the present disclosure, the fourth transistor T4 may be disposed in the first node potential maintaining module 30, and the gate of the fourth transistor T4 may be connected to the first clock signal terminal CK for turning on the fourth transistor T4 in response to the turn-on level of the first clock signal terminal CK. For description purposes only, this embodiment with the fourth transistor T4 as a P-type transistor is used as an example to illustrate the present disclosure, and does not limit the scope of the present disclosure. In some other embodiments, the fourth transistor T4 may be an N-type transistor.

When the fourth transistor T4 is turned on, the signal of the second clock signal terminal XCK may be transmitted to the sixth node N6. In the first node potential maintaining module 30, since the potential of the fifth node N5 may affect the turn-on state of the second transistor T2 and therefore affect the signal transmitted from the second clock signal terminal XCK to the sixth node N6 through the second transistor T2, when the potential of the fifth node N5 changes, the potential transmitted to the sixth node N6 via the second transistor T2 may be unstable. After the fourth transistor T4 is disposed, the fourth transistor T4 may be turned on in response to the turn-on level of the first clock signal terminal CK, and can stably transmit the signal of the second clock signal terminal XCK to the sixth node N6 after being turned on. Therefore, it is ensured that when the potential of the fifth node N5 is unstable, the target potential may still be written into the sixth node N6.

As shown in FIG. 11 and FIG. 12, in one embodiment, the first node potential maintaining module 30 may further include the fifth transistor T5. The gate of the fifth transistor T5 may be connected to the first voltage terminal VGL, and the terminal and the second terminal may be connected in series between the fourth node N4 and the first node N1. In the first output stage, the fifth transistor T5 may be turned on, and the voltage of the input terminal IN may be transmitted to the first node N1 through the fifth transistor T5.

Specifically, the fifth transistor T5 may have the function of limiting the direction of the electrical signal. When the fifth transistor T5 is turned on, the electrical signal can be transmitted from the fourth node N4 to the first node N1, but cannot be transmitted from the first node N1 to the fourth node N4. When the first output control module 11 is turned on, the signal of the first voltage terminal VGL may be output through the first output control module 11. Because of the coupling effect of the first output control module 11, the potential of the first node N1 may change. When the change of the potential of the first node N1 is transmitted to the fourth node N4, the states of the transistors connected to the fourth node N4 may be affected to affect the stability of the circuit. Therefore, by introducing the fifth transistor T5 in this embodiment, the transmission of the electrical signal of the first node N1 to the fourth node N4 may be suppressed, thereby ensuring the stability of the potential of the fourth node N4 and further improving the stability of the circuit.

As shown in FIG. 11 and FIG. 12, in one embodiment, the first node potential maintaining module 30 may further include a third transistor T3. The gate of the third transistor T3 may be connected to the first voltage terminal VGL, the first terminal may be connected to the fourth node N4, and the second terminal may be connected to the fifth node N5. In the first node potential maintaining stage, the third transistor T3 may be turned on, and the signal of the fourth node N4 may be transmitted to the fifth node N5 through the third transistor T3.

Specifically, in the present embodiment, the third transistor T3 may be disposed between the fourth node N4 and the fifth node N5, to limit the direction of the signal. For example, the control electrical signal can only be transmitted from the fourth node N4 to the fifth node N5, but cannot transmit from the fifth node N5 to the fourth node N4. Considering that the potential of the sixth node N6 will change with the change of the potential of the second clock signal terminal XCK in the first node potential maintaining module 30, because of the coupling effect of the first capacitor C1, the potential of the fifth node N5 may change with the second clock signal terminal XCK. Therefore, when the third transistor T3 is introduced, the potential of the fifth node N5 may be prevented from affecting the potential of the fourth node N4 and other transistors connected to the fourth node N4. Therefore, the third transistor T3 may be beneficial to maintaining the stability of the circuit.

Figure 15:
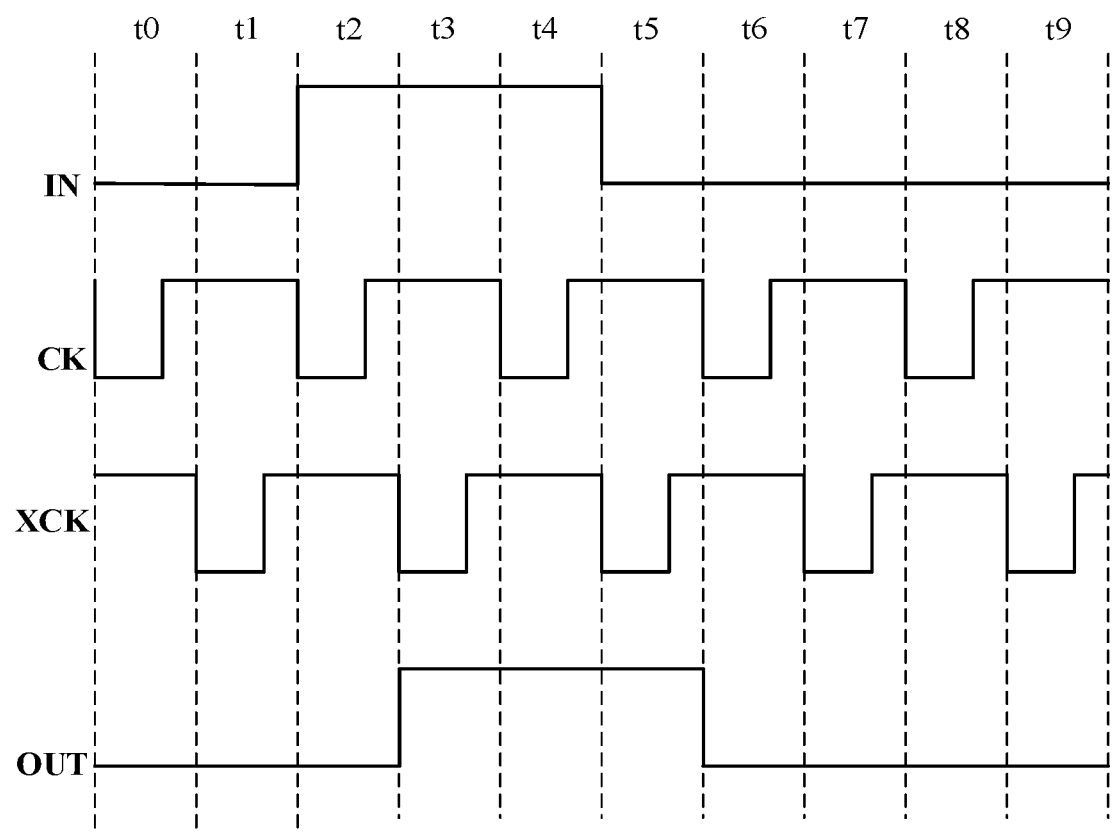
FIG. 15 illustrates a timing diagram of a driving method consistent with various disclosed embodiments in the present disclosure.

The operation process of the shift register 100 in the driving circuit consistent with various embodiments of the present disclosure will be described below in association with FIG. 11, FIG. 12 and FIG. 15. FIG. 15 illustrates a timing diagram of the driving circuit provided by one embodiment of the present disclosure. As shown in FIG. 11, FIG. 12, and FIG. 15, in one embodiment, the driving method of the driving circuit may include stages of t0 to t9.

In the t0 stage, the input terminal IN may be at a low level, the first clock signal terminal CK may be at a low level, the second clock signal terminal XCK may be at a high level, and the sixth transistor T6 may be turned on. The low-level signal of the input terminal IN may be transmitted to the fourth node N4, the first node N1 and the fifth node N5. The fourteenth transistor T14 may be turned on, and the low-level signal of the first voltage terminal VGL may be output through the output terminal OUT. The second transistor T2 may be turned on, and the high level signal of the second clock signal terminal XCK may be transmitted to the sixth node N6.

In the t1 stage, the signal of the second clock signal terminal XCK may change from high level to low level, such that the signal of the sixth node N6 becomes low level. Because of the coupling effect of the first capacitor C1, the signal of the fifth node N5 may become the first level signal lower than the above-mentioned low level signal, the first transistor T1 in FIG. 11 and FIG. 12 may be turned on, such that the first level signal is transmitted to the first node N1. Therefore, the potential of the first node N1 may be pulled down and the fourteenth transistor T14 may be completely turned on, suppressing the output tailing phenomenon. The output terminal OUT may output a low-level signal.

In the t2 stage, the input terminal IN may be at a high level, the first clock signal terminal CK may be at a low level, and the second clock signal terminal XCK may be at a high level. The high level signal of the input terminal IN may be transmitted to the first node N1. The fourteenth transistor T14 may be turned off and the thirteenth transistor T13 may be turned on. The low level signal of the first voltage terminal VGL may be transmitted to the third node N3 through the thirteenth transistor T13, and the ninth transistor T9 may be turned on.

In the t3 stage, the input terminal IN may be at a high level, the first clock signal terminal CK may be at a high level, the second clock signal terminal XCK may be at a low level, and the tenth transistor T10 may be turned on. The low level signal of the second clock signal terminal XCK may be transmitted to the second node N2 through the tenth transistor T10, to pull down the potential of the second node N2. The fifteenth transistor T15 may be turned on, and the high level signal of the second voltage terminal VGH may be output through the output terminal OUT. At this time, the seventh transistor T7 and the eighth transistor T8 in FIG. 11 may be turned on, and the high-level signal of the second voltage terminal VGH may be transmitted to the first node N1 through the eighth transistor T8, the seventh transistor T7, the fourth node N4, and the fifth transistor T5, to ensure that the fourteenth transistor T14 is in an off state. The output stability of the fifteenth transistor T15 may be ensured. The seventh transistor T7 in FIG. 12 may be turned on, and the high-level signal of the second voltage terminal VGH may be transmitted to the first node N1 through the seventh transistor T7, which may also ensure that the fourteenth transistor T14 is in an off state and ensure the output stability of the fifteenth transistor T15.

In the t4 stage, the input terminal IN may be at a high level, the first clock signal terminal CK may be at a low level, the second clock signal terminal XCK may be at a high level, and the high level signal of the input terminal IN may be transmitted to the first node N1. The fourteenth transistor T14 may be turned off, the thirteenth transistor T13 may be turned on, and the low level signal of the first voltage terminal VGL may be transmitted to the third node N3 through the thirteenth transistor T13. The ninth transistor T9 may be turned on, and the tenth transistor T10 may be turned off.

In the t5 stage, the input terminal IN may be at a low level, the first clock signal terminal CK may be at a high level, the second clock signal terminal XCK may be at a low level, and the fifteenth transistor T15 may output a high level through the output terminal OUT.

In the t6 stage, the input terminal IN may be at a low level, the first clock signal terminal CK may be at a low level, the second clock signal terminal XCK may be at a high level, the sixth transistor T6 may be turned on, and the low level signal at the input terminal IN may be transmitted to the first node N1 through the six transistors T6, the fourth node N4 and the fifth transistor T5. The fourteenth transistor T14 may be turned on, and the low-level signal of the first voltage terminal VGL may be output through the fourteenth transistor T14. Because of the coupling effect of the fourteenth transistor T14, when the potential of the output terminal OUT decreases, the potential of the first node N1 may become low and may be lower than the low level signal of the first output terminal OUT. At this time, the fourteenth transistor T14 may be completely turned on, the output terminal OUT may output the low level signal of the first voltage terminal VGL without tailing. At the same time, the low-level signal of the input terminal IN may be written into the fifth node N5 through the fourth node N4, the second transistor T2 may be turned on, and the high-level signal of the second clock signal terminal XCK may be written into the sixth node through the second transistor T2. Therefore, the signal at one of the two terminals of the first capacitor C1 may be high and that at another may be low.

In the t7 stage, the signal of the second clock signal terminal XCK may change from high level to low level, and the potential transmitted to the sixth node N6 may decrease to become the low level signal of the second clock signal terminal XCK. Because of the coupling effect of the first capacitor C1, the potential of the fifth node N5 may be pulled down to become lower than the above-mentioned low-level signal. Assuming that the signal of the fifth node N5 is a first-level signal, since the gate of the first transistor T1 in FIG. 11 may be connected to the fifth node N5, the first level signal of the fifth node N5 may make the first transistor T1 be turned on. The first transistor T1 in FIG. 12 may be an oxide transistor. The threshold voltage of the oxide transistor may be positive, and the leakage current may be very small. When the potential of the fifth node N5 connected to the first terminal of the first transistor T1 is lower than the potential of the first node N1 connected to the terminal of the first transistor T1 and the input terminal IN connected to the gate of the first transistor T1 is a low-level signal in the t7 stage, the oxide transistor may be turned on. When the first transistor T1 is turned on, the first level signal may be transmitted to the first node N1 through the first transistor T1, and the potential of the first node N1 may be pulled down, such that the fourteenth transistor T14 can still be fully turned on to suppress output tailing.

In the t8 stage, the input terminal IN may be at a low level, the first clock signal terminal CK may be at a low level, the second clock signal terminal XCK may be at a high level, and the low level signal signal of the input terminal IN may be written into the fifth node N5 through the fourth node N4. The second transistor T2 may be turned on, and the high level signal of the second clock signal terminal XCK may be written into the sixth node N6.

In the t9 stage, the signal of the second clock signal terminal XCK may change from high level to low level, the potential transmitted to the sixth node N6 may decrease and become the low level signal of the second clock signal terminal XCK. Because of the coupling effect of C1, the potential of the fifth node N5 may be pulled down to much lower than the above-mentioned low-level signal. Assuming that the signal of the fifth node N5 is the first-level signal, the first-level signal may turn on the first transistor T1 and may be transmitted to the first node N1. The potential of the first node N1 may be pulled down, such that the fourteenth transistor T14 can still be fully turned on, and the output tailing phenomenon may be suppressed.

In the driving circuit provided by the present disclosure, at least two shift registers in cascade may be provided. Each shift register may include a first output control module, a second output control module, a first node control module, a second node control module and a third node control module. The first output control module and the second output control module may be alternately turned on, such that the signal of the first voltage terminal and the signal of the second voltage terminal may be alternately output from the output terminal. In particular, in the gate driving circuit provided by the embodiments of the present disclosure, a first node potential maintaining module may be introduced into the shift register, and the first node potential maintaining module may be used to transmit the first level signal to the first node in response to the turn-on level of the fourth node and the signal of the second clock signal terminal. The voltage of the first level signal may be lower than the voltage of the first voltage terminal. When the first output control module is turned on and outputs the signal of the first voltage terminal through the output control module, the first node potential maintaining module may be controlled to transmit a first level signal with a smaller voltage value to the first node, to pull down the potential of the first node. When the potential of the first node is pulled down, the loss of the threshold value of the first node may be compensated. After the threshold value of the first node is compensated, it may be beneficial to maintain the turn-on state of the first output control module in a constant state, such that the first output control module is fully turned on and can constantly output the signal of the first voltage terminal from the first output control module. The smearing phenomenon may be suppressed. The display effect of the display panel where the driving circuit is applied may be improved.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure.

Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A driving circuit comprising:
at least two shift registers in cascade, each shift register of the at least two shift registers including:
    an input terminal, an output terminal, a first voltage terminal, a second voltage terminal, a first clock signal terminal, a second clock signal terminal;
    a first output control module, configured to transmit a voltage of the first voltage terminal to the output terminal in response to a turn-on level of a first node;
    a second output control module, configured to transmit a voltage of the second voltage terminal to the output terminal in response to a turn-on level of a second node;
    a first node control module, configured to transmit a voltage of the input terminal to the first node in response to a turn-on level of the first clock signal terminal, and transmit a voltage of the second voltage terminal to the first node in response to turn-on levels of the second clock signal terminal and the third node or in response to the turn-on level of the second node;
    a second node control module, configured to transmit the voltage of the second voltage terminal to the second node in response to the turn-on level of the first node, and transmit a voltage of the second clock signal terminal to the second node in response to turn-on levels of a third node and the second clock signal terminal;
    a third node control module, configured to transmit the voltage of the first voltage terminal to the third node in response to the turn-on level of the first clock signal terminal, and transmit the voltage of the first clock signal terminal to the third node in response to a turn-on level of a fourth node; and
    a first node potential maintaining module electrically connected to the fourth node with the first node control module, configured to transmit a first level signal to the first node in response to the turn-on level of the fourth node and a signal at the second clock signal terminal, or in response to signals at the input terminal, the fourth node and the second clock signal terminal, wherein a voltage of the first level signal is lower than the voltage of the first voltage terminal, wherein:
    the first node potential maintaining module includes a first transistor, a second transistor, a fourth transistor, and a first capacitor;
    a gate of the first transistor and a first terminal of the first transistor are connected and coupled to a fifth node;
    a second terminal of the first transistor is connected to the first node;
    the fifth node is electrically connected to the fourth node;
    in the second transistor, a gate is connected to the fifth node, a first terminal is connected to the second clock signal terminal, and a second terminal is connected to a sixth node;
    in the fourth transistor, a gate is connected to the first clock signal terminal, a first terminal is connected to the second clock signal terminal, and a second terminal is connected to the sixth node; and two terminals of the first capacitor are respectively connected to the sixth node and the first terminal of the first transistor.

2. The driving circuit according to claim 1, wherein:
the first node potential maintaining module is connected in series between the fourth node and the first node;
the first node control module is connected to the first node through the fourth node;
the second node control module is electrically connected to the second node and the third node respectively;
the third node control module is connected to the third node;
the first output control module and the second output control module are connected in series between the first voltage terminal and the second voltage terminal;
a control terminal of the first output control module is connected to the first node; and
a control terminal of the second output control module is connected to the second node.

3. The driving circuit according to claim 1, wherein:
the first node potential maintaining module further includes a third transistor; and
in the third transistor, a gate is connected to the first voltage terminal, a first terminal is connected to the fourth node, and a second terminal is connected to the fifth node.

4. The driving circuit according to claim 1, wherein:
the first node potential maintaining module further includes a fifth transistor; and
in the fifth transistor, a gate is connected to the first voltage terminal, and a first terminal and a second terminal are connected in series between the fourth node and the first node.

5. The driving circuit according to claim 1, wherein:
the first node control module includes a sixth transistor, a seventh transistor and an eighth transistor;
in the sixth transistor, a gate is connected to the first clock signal terminal, a first terminal is connected to the input terminal, and a second terminal is connected to the fourth node;
in the seventh transistor, a gate is connected to the second clock signal terminal, a first terminal is connected to a second terminal of the eighth transistor, and a second terminal is connected to the fourth node; and
in the eighth transistor, a gate is connected to the third node, and a first terminal is connected to the second voltage terminal.

6. The driving circuit according to claim 1, wherein:
the first node control module includes a sixth transistor and a seventh transistor;
in the sixth transistor, a gate is connected to the first clock signal terminal, a first terminal is connected to the input terminal, and a second terminal is connected to the fourth node; and
in the seventh transistor, a gate is connected to the second node, a first terminal is connected to the second voltage terminal, and a second terminal is connected to the first node.

7. The driving circuit according to claim 1, wherein:
the second node control module includes a ninth transistor, a tenth transistor, an eleventh transistor, a second capacitor, and a third capacitor;
in the ninth transistor, a gate is connected to the third node, and a first terminal is connected to the second clock signal terminal;

the second capacitor is coupled and connected between the gate of the ninth transistor and a second terminal of the ninth transistor;
in the tenth transistor, a gate is connected to the second clock signal terminal, a first terminal is connected to the first terminal of the ninth transistor, and a second terminal is connected to the second node;
in the eleventh transistor, a gate is connected to the fourth node, a first terminal is connected to the second voltage terminal, and a second terminal is connected to the second node; and
the third capacitor is coupled and connected between the second voltage terminal and the second node.

8. The driving circuit according to claim 1, wherein:
the third node control module includes a twelfth transistor and a thirteenth transistor;
in the twelfth transistor, a gate is connected to the fourth node and a first terminal is connected to the third node;
a second terminal of the twelfth transistor and a gate of the thirteenth transistor are connected to the first clock signal terminal;
in the thirteenth transistor, a first terminal is connected to the first voltage terminal, and a second terminal is connected to the third node.

9. The driving circuit according to claim 1, wherein:
the first output control module includes a fourteenth transistor; and
in the fourteenth transistor, a gate is connected to the first node, a first terminal is connected to the first voltage terminal, and a second terminal is connected to the output terminal.

10. The driving circuit according to claim 1, wherein:
the second output control module includes a fifteenth transistor; and
in the fifteenth transistor, a gate is connected to the second node, a first terminal is connected to the second voltage terminal, and a second terminal is connected to the output terminal.

11. The driving circuit according to claim 1, wherein the driving circuit is a gate driving circuit.

12. A driving circuit, comprising:
at least two shift registers in cascade, each shift register of the at least two shift registers including:
an input terminal, an output terminal, a first voltage terminal, a second voltage terminal, a first clock signal terminal, a second clock signal terminal;
a first output control module, configured to transmit a voltage of the first voltage terminal to the output terminal in response to a turn-on level of a first node;
a second output control module, configured to transmit a voltage of the second voltage terminal to the output terminal in response to a turn-on level of a second node;
a first node control module, configured to transmit a voltage of the input terminal to the first node in response to a turn-on level of the first clock signal terminal, and transmit a voltage of the second voltage terminal to the first node in response to turn-on levels of the second clock signal terminal and the third node or in response to the turn-on level of the second node;
a second node control module, configured to transmit the voltage of the second voltage terminal to the second node in response to the turn-on level of the first node, and transmit a voltage of the second clock signal terminal to the second node in response to turn-on levels of a third node and the second clock signal terminal;

a third node control module, configured to transmit the voltage of the first voltage terminal to the third node in response to the turn-on level of the first clock signal terminal, and transmit the voltage of the first clock signal terminal to the third node in response to a turn-on level of a fourth node; and a first node potential maintaining module electrically connected to the fourth node with the first node control module, configured to transmit a first level signal to the first node in response to the turn-on level of the fourth node and a signal at the second clock signal terminal, or in response to signals at the input terminal, the fourth node and the second clock signal terminal, wherein a voltage of the first level signal is lower than the voltage of the first voltage terminal, wherein:

the first node potential maintaining module includes a first transistor, a second transistor and a first capacitor;

in the first transistor, a gate is connected to the input terminal, a first terminal is connected to a fifth node, and a second terminal is connected to the first node;

the fifth node is electrically connected to the fourth node;

in the second transistor, a gate is connected to the fifth node, a first terminal is connected to the second clock signal terminal, and a second terminal is connected to a sixth node;

two terminals of the first capacitor are respectively connected to the sixth node and the fifth node; and the first transistor is an oxide transistor.

13. The driving circuit according to claim 12, wherein:
the first node potential maintaining module further includes a third transistor; and
in the third transistor, a gate is connected to the first voltage terminal, a first terminal is connected to the fourth node, and a second terminal is connected to the fifth node.

14. The driving circuit according to claim 12, wherein:
the first node potential maintaining module further includes a fourth transistor; and
in the fourth transistor, a gate is connected to the first clock signal terminal, a first terminal is connected to the second clock signal terminal, and a second terminal is connected to the sixth node.

15. A driving method of a driving circuit, wherein:
the driving circuit includes at least two shift registers in cascade; and
each of the at least two shift registers includes:
an input terminal, an output terminal, a first voltage terminal, a second voltage terminal, a first clock signal terminal, a second clock signal terminal;
a first output control module, configured to transmit a voltage of the first voltage terminal to the output terminal in response to a turn-on level of a first node;
a second output control module, configured to transmit a voltage of the second voltage terminal to the output terminal in response to a turn-on level of a second node;
a first node control module, configured to transmit a voltage of the input terminal to the first node in response to a turn-on level of the first clock signal terminal, and transmit a voltage of the second voltage terminal to the first node in response to turn-on levels of the second clock signal terminal and the third node or in response to the turn-on level of the second node;

a second node control module, configured to transmit the voltage of the second voltage terminal to the second node in response to the turn-on level of the first node, and transmit a voltage of the second clock signal terminal to the second node in response to turn-on levels of a third node and the second clock signal terminal;

a third node control module, configured to transmit the voltage of the first voltage terminal to the third node in response to the turn-on level of the first clock signal terminal, and transmit the voltage of the first clock signal terminal to the third node in response to a turn-on level of a fourth node; and a first node potential maintaining module is electrically connected to the fourth node with the first node control module, configured to transmit a first level signal to the first node in response to the turn-on level of the fourth node and a signal at the second clock signal terminal, or in response to signals at the input terminal, the fourth node and the second clock signal terminal, wherein a voltage of the first level signal is lower than the voltage of the first voltage terminal; and the driving method includes:
in a first output stage, the first node control module transmits the voltage of the input terminal to the first node in response to the turn-on level of the first clock signal terminal, such that the first output control module is turned on and the signal of the first voltage terminal is output through the output terminal; and in a first node voltage maintaining stage, the first node potential maintaining module transmits the signal of the input terminal to the fourth node in response to the turn-on level of the first clock signal terminal, and transmits the first level signal to the first node in response to the signal of the fourth node and the signal of the second clock signal terminal or in response to the signals of the input terminal, the fourth node and the second clock signal terminal, wherein the voltage of the first level signal is lower than the voltage of the first voltage terminal, wherein:

the first node potential maintaining module includes a first transistor, a second transistor, a fourth transistor, and a first capacitor;

a gate of the first transistor and a first terminal of the first transistor are connected and coupled to a fifth node, or the first transistor is an oxide transistor, a gate of the first transistor is connected to the input terminal, a first terminal of the first transistor is connected to the fifth node, and a second terminal of the first transistor is connected to the first node;

the fifth node is electrically connected to the fourth node;

in the second transistor, a gate is connected to the fifth node, a first terminal is connected to the second clock signal terminal, and a second terminal is connected to a sixth node;

in the fourth transistor, a gate is connected to the first clock signal terminal, a first terminal is connected to the second clock signal terminal, and a second terminal is connected to the sixth node;

two terminals of the first capacitor are respectively connected to the sixth node and the first terminal of the first transistor;

in the first output stage, the first transistor is turned off, the signal of the input terminal is transmitted to the fifth node via the fourth node, the second transistor is controlled to be turned on, and the signal of the second clock signal terminal is transmitted to the sixth node, and the potential of one terminal of the first capacitor connected to the sixth node is higher than the potential of another terminal of the first capacitor connected to the gate and the first terminal of the first transistor; and in the first node potential maintaining stage, the fourth transistor is turned on in response to the signal of the first clock signal terminal, and the signal of the second clock signal terminal is transmitted to the sixth node through the fourth transistor.

16. The driving method according to claim 15, wherein:

in the first node potential maintaining stage, the second clock signal terminal changes from a high-level signal to a low-level signal and transmits the low-level signal to the sixth node, the potential of the fifth node decreases to a first level signal by the coupling effect of the first capacitor, such that the first transistor is turned on and transmits the first level signal to the first node.

17. The driving method according to claim 15, wherein:

the first node potential maintaining module further includes a fifth transistor;

in the fifth transistor, a gate is connected to the first voltage terminal, a first terminal and a second terminal are connected in series between the fourth node and the first node; and in the first output stage, the fifth transistor is turned on and the voltage of the input terminal is transmitted to the first node through the fifth transistor.

18. The driving method according to claim 15, wherein:

the first node potential maintaining module further includes a third transistor;

in the third transistor, a gate is connected to the first voltage terminal, a first terminal is connected to the fourth node, and a second terminal is connected to the fifth node; and in the first node potential maintaining stage, the third transistor is turned on, and the signal of the fourth node is transmitted to the fifth node through the third transistor.

* * * * *